United States Patent
Jeon et al.

(10) Patent No.: US 12,364,099 B2
(45) Date of Patent: Jul. 15, 2025

(54) DISPLAY PANEL HAVING LIGHT SHIELDING MEMBER WITH DIFFERENT THICKNESS

(71) Applicant: Samsung Display Co., Ltd., Yongin-Si (KR)

(72) Inventors: Bogeon Jeon, Hwaseong-si (KR); Kabjong Seo, Hwaseong-si (KR); Hokyung Jang, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 530 days.

(21) Appl. No.: 17/886,546

(22) Filed: Aug. 12, 2022

(65) Prior Publication Data

US 2023/0137129 A1    May 4, 2023

(30) Foreign Application Priority Data

Nov. 1, 2021  (KR) .......................... 10-2021-0147700

(51) Int. Cl.
    *H10K 59/40*    (2023.01)
    *H10K 50/844*   (2023.01)
    *H10K 50/86*    (2023.01)
    *H10K 59/122*   (2023.01)

(52) U.S. Cl.
    CPC ......... *H10K 50/865* (2023.02); *H10K 50/844* (2023.02); *H10K 59/122* (2023.02); *H10K 59/40* (2023.02)

(58) Field of Classification Search
    CPC .. H10K 50/844; H10K 50/865; H10K 59/122; H10K 59/35; H10K 59/351; H10K 59/40; H10K 59/87; H10K 59/8792; H10K 59/873
    USPC ............................................................ 257/88
    See application file for complete search history.

(56) References Cited

U.S. PATENT DOCUMENTS

| | | | |
|---|---|---|---|
| 9,837,638 B2 | 12/2017 | Kim et al. | |
| 9,978,816 B2 | 5/2018 | Kim et al. | |
| 2025/0008763 A1* | 1/2025 | Wang | H10K 50/858 |

FOREIGN PATENT DOCUMENTS

| | | |
|---|---|---|
| KR | 10-2016-0071581 | 6/2016 |
| KR | 10-2016-0127274 | 11/2016 |
| KR | 10-1787978 | 10/2017 |

* cited by examiner

*Primary Examiner* — Hoai V Pham
(74) *Attorney, Agent, or Firm* — F. CHAU & ASSOCIATES, LLC

(57) ABSTRACT

A display panel includes a display device layer including first to third light emitting areas and a non-tight emitting area and a light shielding member disposed on the display device layer. The light shielding member overlaps the non-light emitting area and includes light shielding openings corresponding to the first to third light emitting areas. A first portion of the light shielding member disposed between the first light emitting area and the second light emitting area has a first thickness at a first edge adjacent to the first light emitting area and a second thickness that is different from the first thickness at a second edge adjacent to the second light emitting area. A second portion of the light shielding member is disposed between the first light emitting area and the third light emitting area and has a uniform thickness.

20 Claims, 18 Drawing Sheets

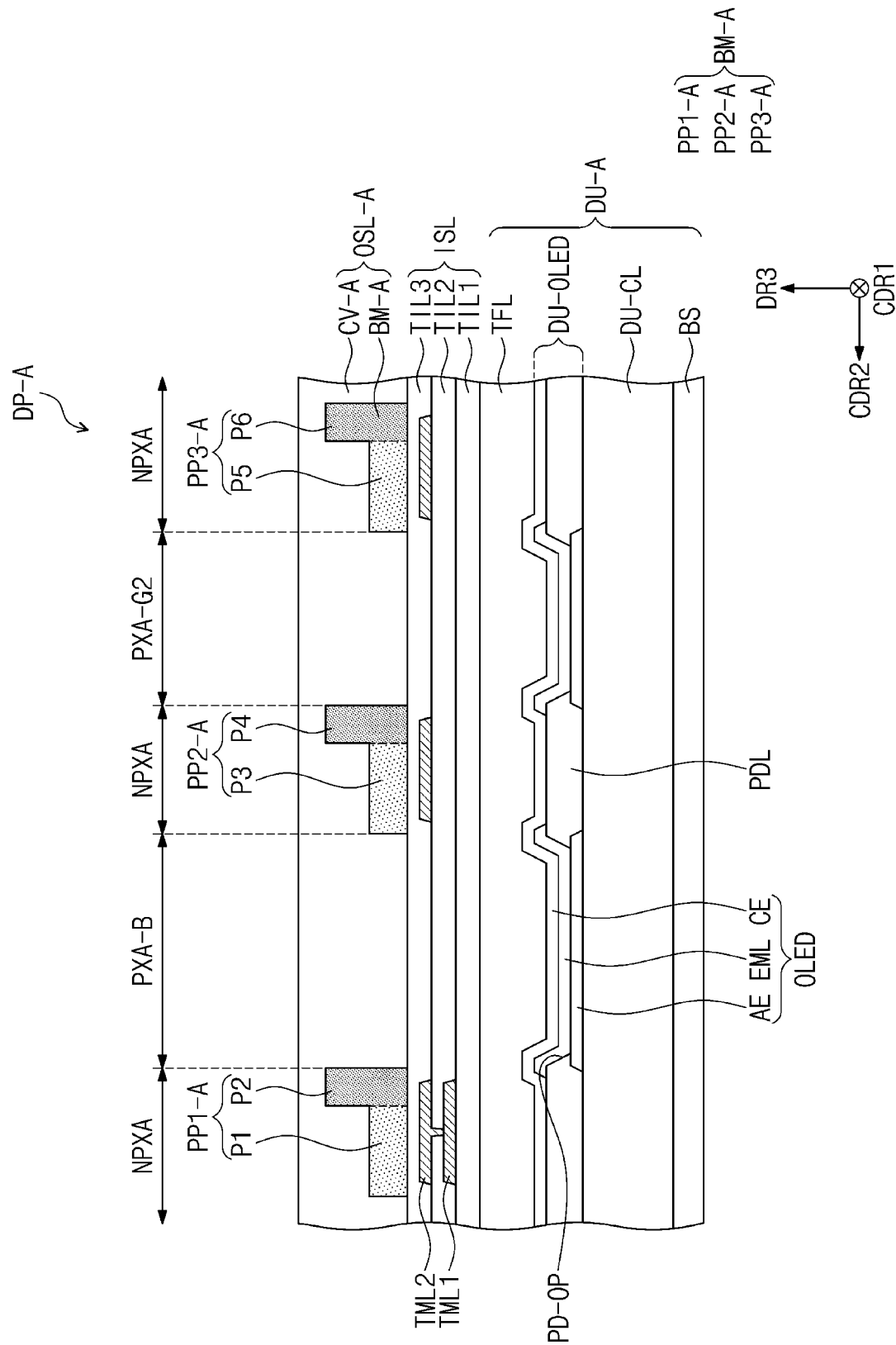

DISPLAY PANEL HAVING LIGHT SHIELDING MEMBER WITH DIFFERENT THICKNESS

CROSS-REFERENCE TO RELATED APPLICATIONS

This application claims priority under 35 U.S.C. § 119 to Korean Patent Application No. 10-2021-0147700, filed on Nov. 1, 2021 in the Korean Intellectual Property Office, the disclosure of which is incorporated by reference in its entirety herein.

TECHNICAL FIELD

The present disclosure herein relates to a display panel having a structure having an increased viewing angle.

DISCUSSION OF RELATED ART

A display panel includes a transmissive display panel that selectively transmits source light generated from a light source and a light emitting display panel generating source light from the display panel itself. The display panel may include a light control layer for adjusting a path of light generated from a display device layer. The light control layer may block the path of light at a specific angle.

SUMMARY

Embodiments of the present inventive concept provides a display panel including a light control layer having a light shielding function at a specific angle.

According to an embodiment of the present inventive concept, a display panel includes a display device layer comprising a first light emitting area, a second light emitting area spaced apart from the first light emitting area in a column direction, a third light emitting area spaced apart from the first light emitting area in a row direction crossing the column direction and a non-light emitting area disposed between the first to third light emitting areas. A light shielding member is disposed on the display device layer. The light shielding member overlaps the non-light emitting area and includes light shielding openings corresponding to the first to third light emitting areas. A first portion of the light shielding member disposed between the first light emitting area and the second light emitting area has a first thickness at a first edge adjacent to the first light emitting area and a second thickness that is different from the first thickness at a second edge adjacent to the second light emitting area. A second portion of the light shielding member disposed between the first light emitting area and the third light emitting area has a uniform thickness.

In an embodiment, the first thickness may be less than the second thickness.

In an embodiment, the second portion may have a same thickness as the first thickness.

In an embodiment, the display device layer may farther include a fourth light emitting area spaced apart from the second light emitting area in the row direction and spaced apart from the third light emitting area in the column direction, and a third portion disposed between the third light emitting area and the fourth light emitting area in the light shielding member may have a third thickness at a third edge adjacent to the third light emitting area and a fourth thickness that is greater than the third thickness at a fourth edge adjacent to the fourth light emitting area.

In an embodiment, the third thickness may be equal to the first thickness, and the fourth thickness may be equal to the second thickness.

In an embodiment, a fourth portion disposed between the second light emitting area and the fourth light emitting area in the light shielding member may have a same thickness as the second portion.

In an embodiment, the first portion and the third portion may have an integrated shape extending in the row direction.

In an embodiment, in a cross-section, the first portion may include a first partition wall having the first edge having the first thickness and a second partition wall having the second edge having the second thickness, and an angle between the first partition wall and the second partition wall may be a right angle.

In an embodiment, the first portion may have a curved surface having a thickness varying from the first thickness to the second thickness from the first edge to the second edge.

In an embodiment, the curved surface may have an irregular shape.

In an embodiment, the display panel may further include an encapsulation layer disposed on the display device layer and including inorganic layers and at least one organic layer disposed between the inorganic layers, and the light shielding member may be disposed on the encapsulation layer.

In an embodiment, the display panel may further include a cover layer covers the light shielding member, and the cover layer may include at least one of an organic material and an inorganic material.

In an embodiment, the display panel may further include: an encapsulation layer disposed on the display device layer; an input sensor disposed on the encapsulation layer and comprising mesh lines overlapping the light shielding member and a sensing insulation layer; and a cover layer covering the light shielding member. The light shielding member may disposed on the input sensor.

In an embodiment, the display panel may further include an additional light shielding member disposed on the cover layer and an additional cover layer covering the additional light shielding member and disposed on the cover layer.

In an embodiment, the first to third light emitting areas may have different surface areas from each other.

In an embodiment, the display device layer may include light emitting devices each including a first electrode, a second electrode, and a light emitting layer disposed between the first electrode and the second electrode; and a pixel defining layer including openings each exposing at least a portion of each of the first electrodes.

In an embodiment, the first thickness may be less than the second thickness, the second portion may have the same thickness as the first thickness, each of the openings may be defined by inner surfaces of the pixel defining layer, one inner surface of the inner surfaces may face a portion having the second thickness in the light shielding member, and each of the remaining inner surfaces of the inner surfaces may face a portion having the first thickness on a plane.

According to an embodiment of the present inventive concept, a display panel includes a display device layer comprising light emitting areas spaced apart from each other in a first direction and a second direction that cross each other, and a non-light emitting area disposed between the light emitting areas. A light shielding member is disposed on the display device layer. The light shielding member a overlaps the non-light emitting area and includes light shielding openings corresponding to the light emitting areas. A first portion of the light shielding member has a first thickness at a first edge adjacent to a first light emitting area among the light emitting areas and a second thickness less than the first thickness at a second edge spaced apart from the first light emitting area. A second portion of the light shielding member facing the first portion in the first direction has a third thickness at a third edge adjacent to the first light emitting area and a fourth thickness greater than the third thickness at a fourth edge spaced further than the second edge from the first light emitting area.

In an embodiment, the first thickness may be equal to the fourth thickness, and the second thickness may be equal to the third thickness.

In an embodiment, at least one side surface among side surfaces of each of the light emitting areas may be adjacent to a portion having the first thickness in the light shielding member, and each of remaining side surfaces of the side surfaces may be adjacent to a portion having the second thickness in the light shielding member.

BRIEF DESCRIPTION OF THE DRAWINGS

The accompanying drawings are included to provide a further understanding of the present inventive concept, and are incorporated in and constitute a part of this specification. The drawings illustrate embodiments of the present inventive concept and, together with the description, serve to explain principles of the present inventive concept. In the drawings:

FIG. 9B is a cross-sectional view illustrating the display panel according to an embodiment of the present inventive concept;

DETAILED DESCRIPTION OF EMBODIMENTS

Figure 1A:
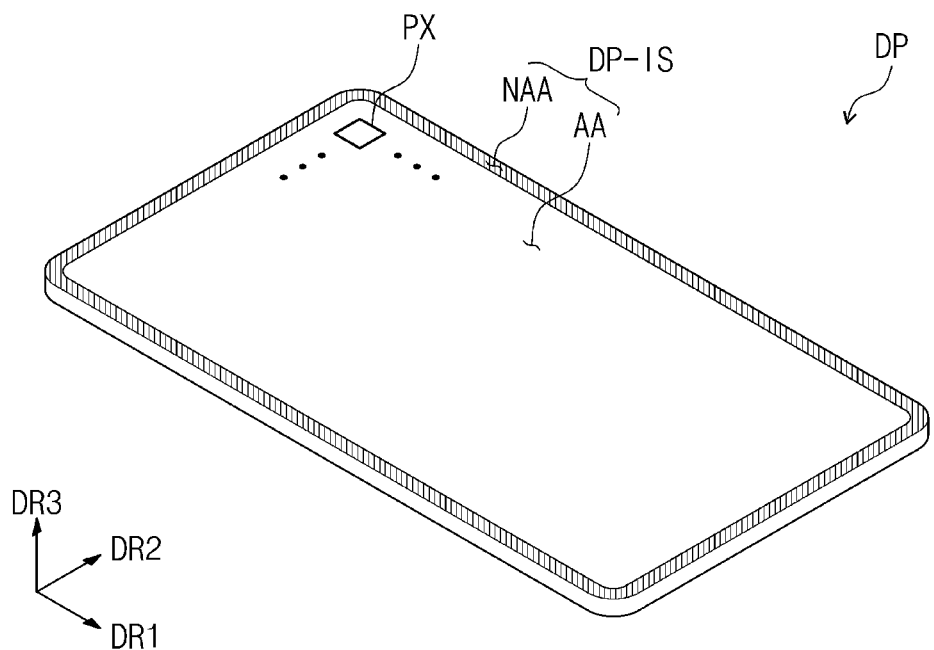
FIG. 1A is a perspective view illustrating a display panel according to an embodiment of the present inventive concept.

In this specification, it will be understood that when one component (or region, layer, portion) is referred to as being 'on', 'connected to', or 'coupled to' another component, it can be directly disposed/connected/coupled onto the one component, or an intervening third component may also be present. When one component (or region, layer, portion) is referred to as being 'directly on', 'directly connected to', or 'directly coupled to' another component, no intervening third component may be present.

Like reference numerals refer to like elements throughout. Also, in the figures, the thickness, ratio, and dimensions of components are exaggerated for clarity of illustration. As used herein, the term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in an embodiment without departing from the scope of the present disclosure. The terms of a singular form may include plural forms unless referred to the contrary.

Also, spatially relative tennis, such as "below", "lower", "above", and "upper", may be used herein for ease of description to describe an element and/or a relationship of a feature to another element(s) and/or feature(s) as illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments of the present inventive concept will be described with reference to the accompanying drawings.

Figure 1B:
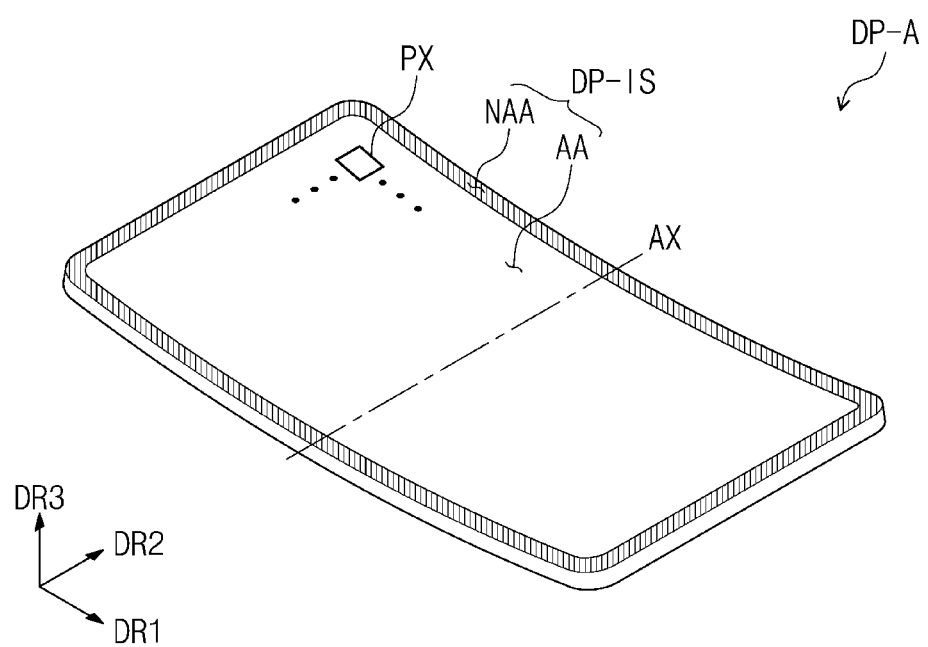
FIG. 1B is a perspective view illustrating a curved display panel according to an embodiment of the present inventive concept.
Figure 2:
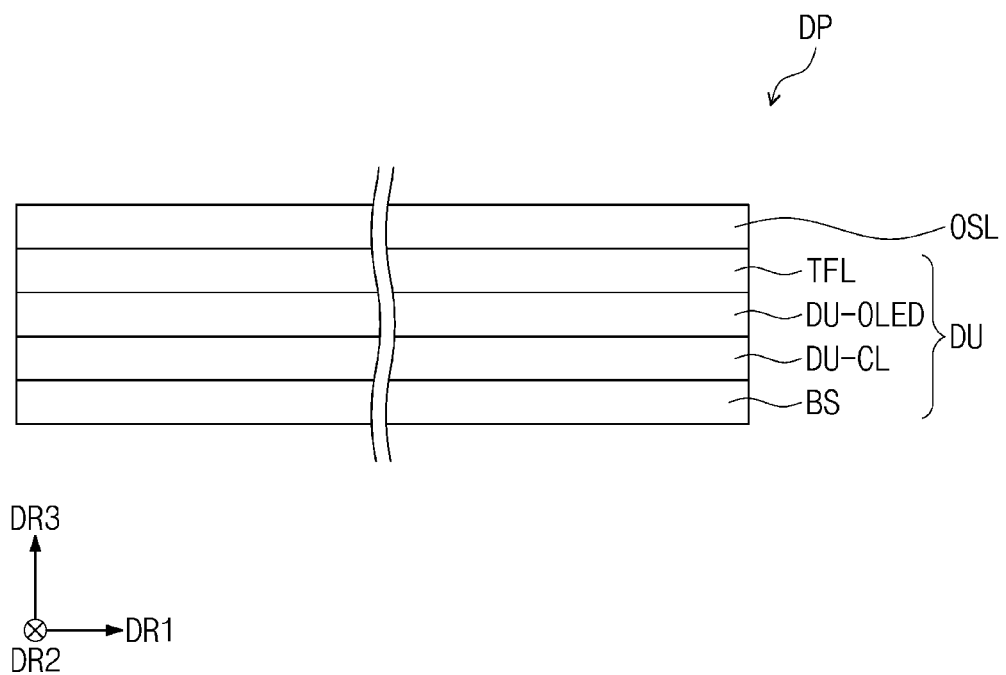
FIG. 2 is a cross-sectional view illustrating the display panel according to an embodiment of the present inventive concept.
Figure 3:
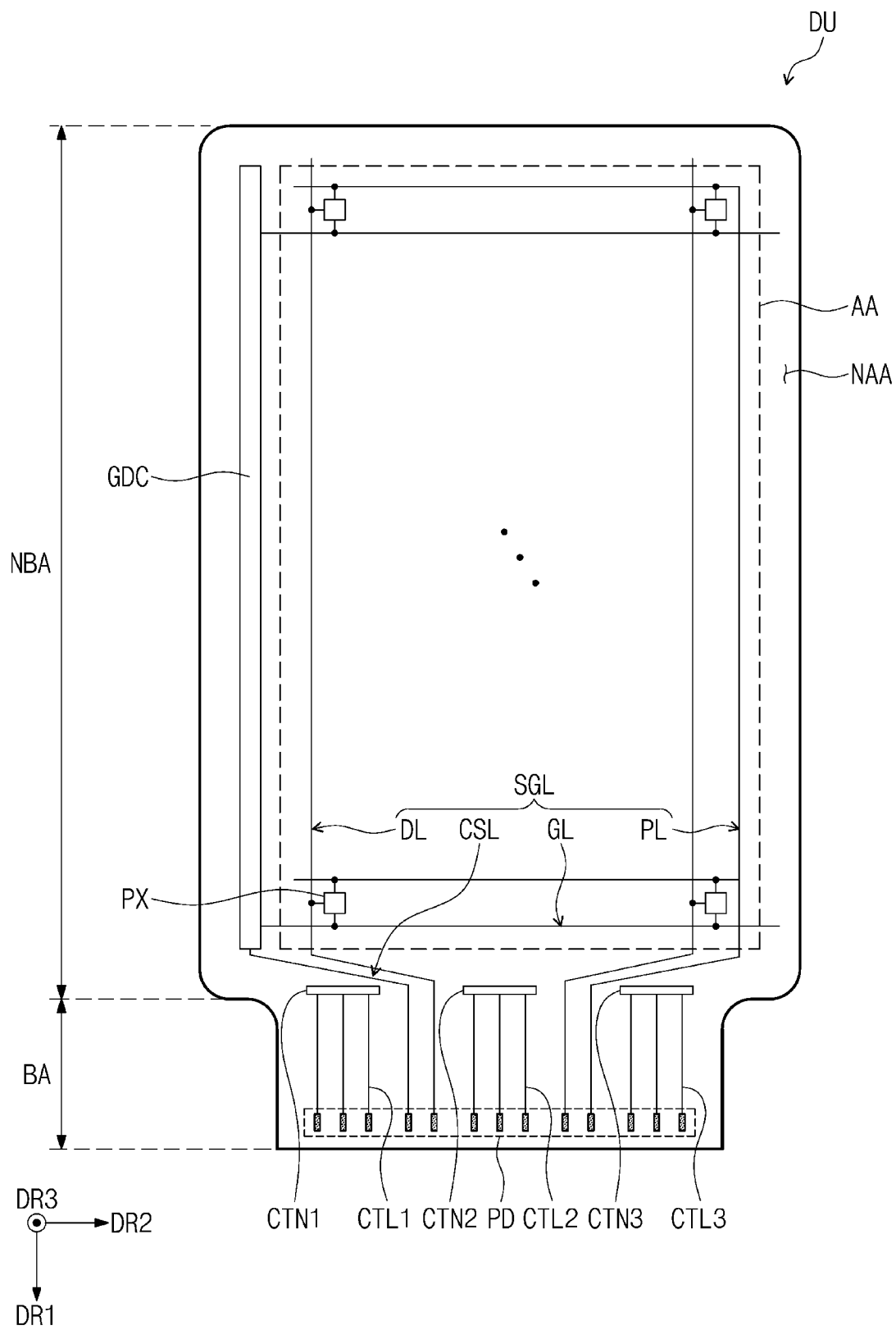
FIG. 3 is a plan view illustrating a display unit according to an embodiment of the present inventive concept.
Figure 4:
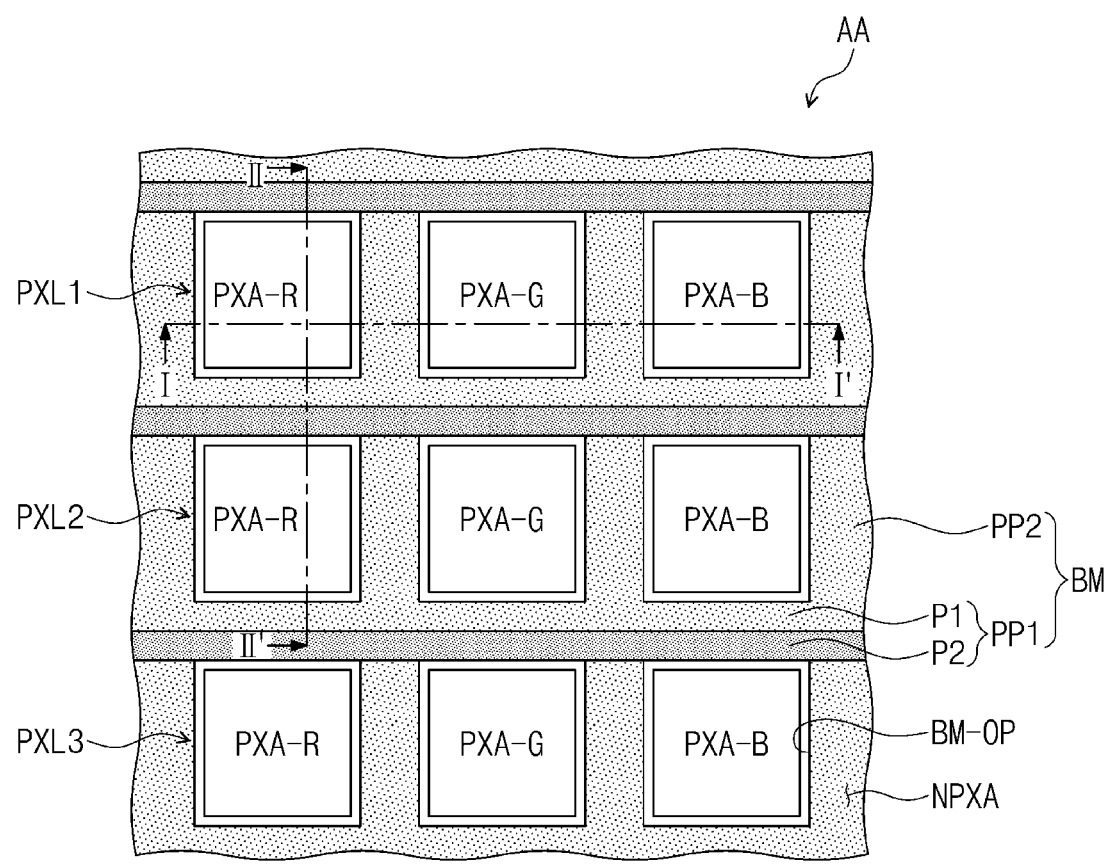
FIG. 4 is an enlarged view illustrating an active area according to an embodiment of the present inventive concept.
Figure 5A:
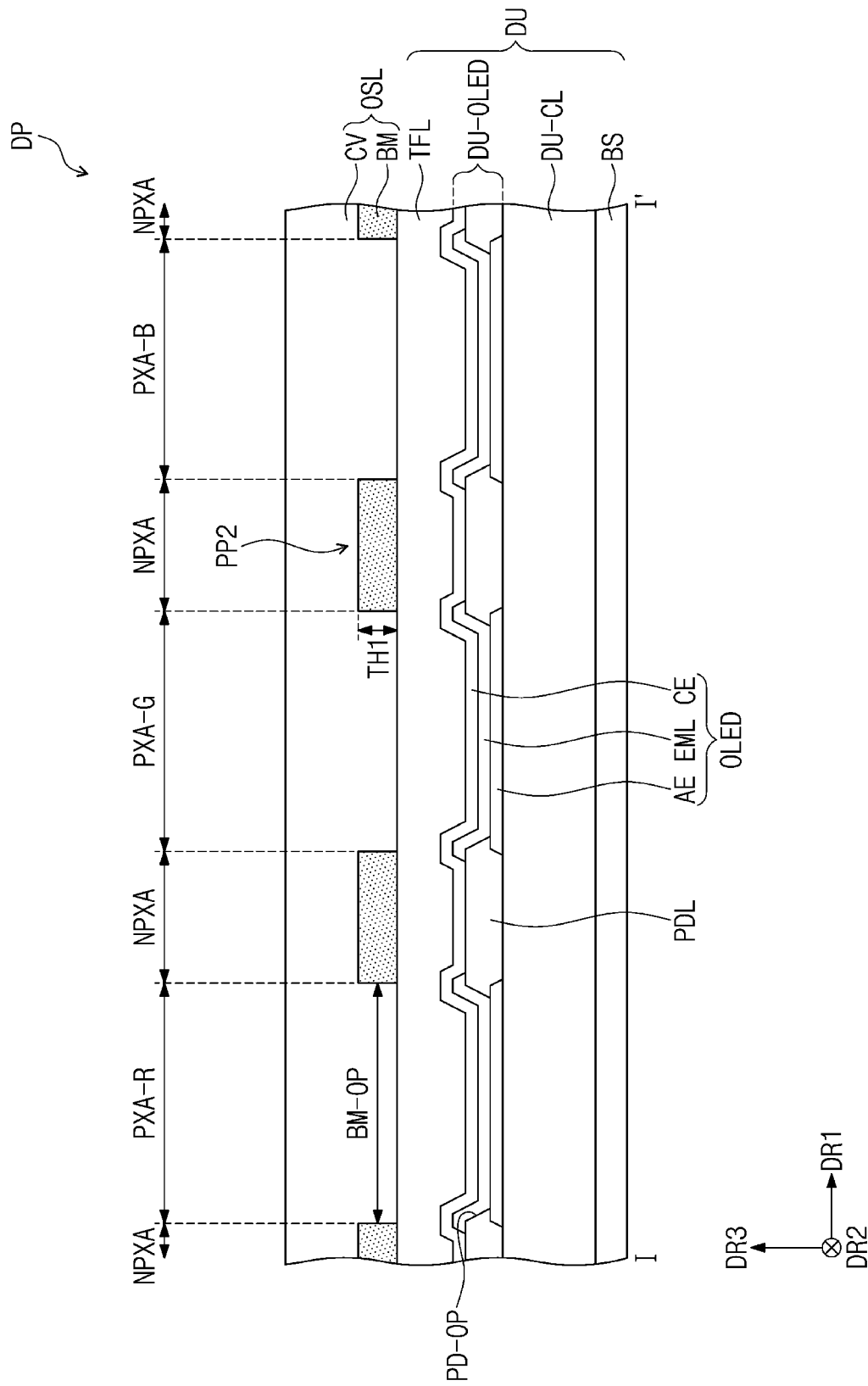
FIG. 5A is a cross-sectional view taken along line I-I' of FIG. 4 according to an embodiment of the present inventive concept.
Figure 5B:
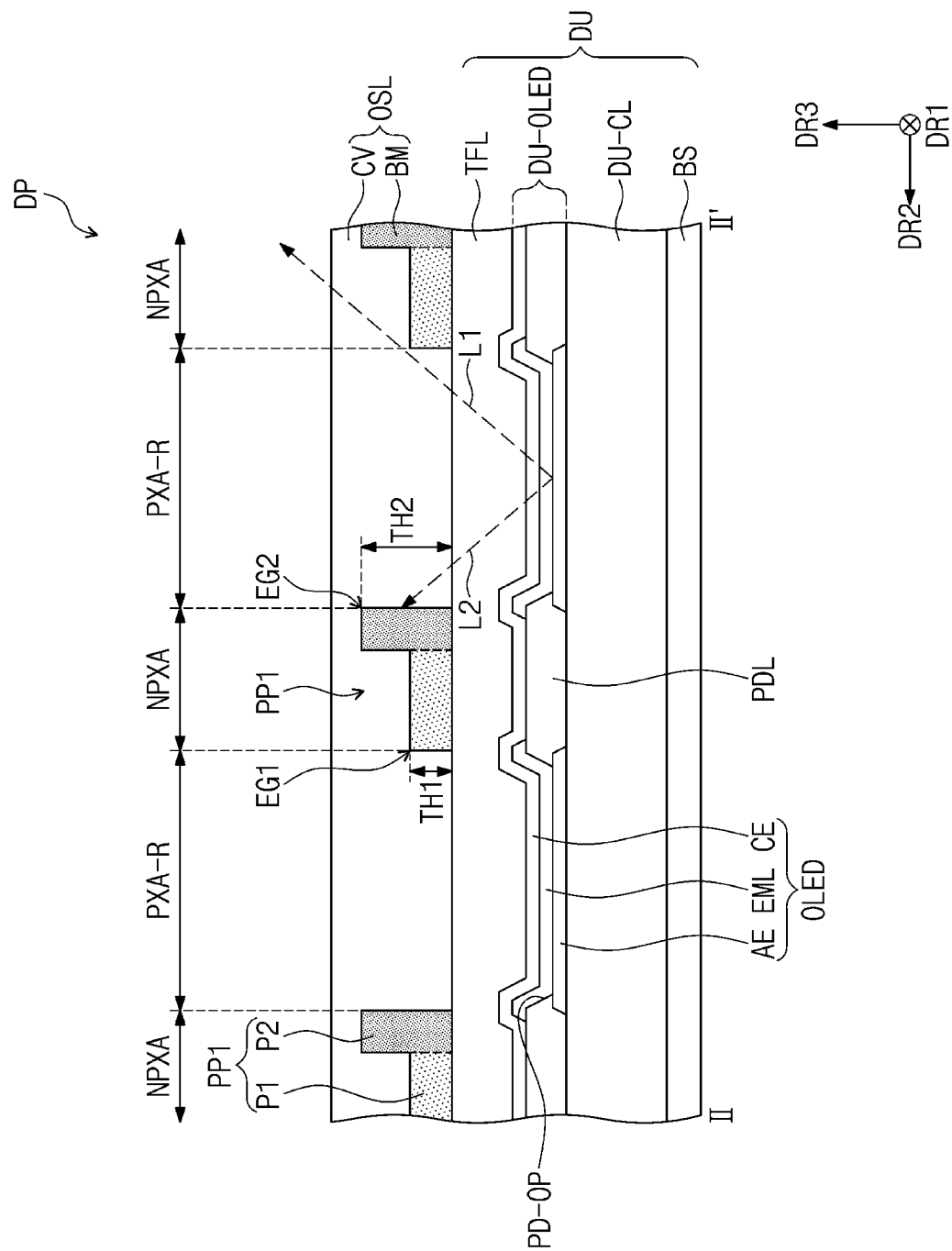
FIG. 5B is a cross-sectional view taken along line II-II' of FIG. 4 according to an embodiment of the present inventive concept.

FIG. 1A is a perspective view illustrating a display panel according to an embodiment of the present inventive concept. FIG. 1B is a perspective view illustrating a curved display panel according to an embodiment of the present inventive concept. FIG. 2 is a cross-sectional view illustrating the display panel according to an embodiment of the present inventive concept. FIG. 3 is a plan view illustrating a display unit according to an embodiment of the present inventive concept. FIG. 4 is an enlarged view illustrating an active area according to an embodiment of the present inventive concept. FIG. 5A is a cross-sectional view taken along line I-I' of FIG. 4. FIG. 5B is a cross-sectional view taken along line II-II' of FIG. 4.

In an embodiment, a display panel DP and DP-A in FIGS. 1A an 1B, as a light emitting display panel, may be one of a liquid crystal display panel, an electrophoretic display panel, a microelectromechanical system (MEMS) display panel, an electrowetting display panel, an organic light emitting display panel, an inorganic light emitting display panel, and a quantum-dot display panel. However, the embodiment of the present inventive concept is not limited thereto.

Referring to FIG. 1A, the display panel DP may display an image through a display surface DP-IS. The display surface DP-IS is parallel to a plane defined by a first direction DR1 and a second direction DR2. A top surface of a member disposed at an uppermost side of the display panel DP may be defined as the display surface DP-IS. For example, in an embodiment in which the member disposed at the uppermost side of the display panel DP is a window, a top surface of the window may be the display surface DP-IS. The display panel DP may further include a housing defining an appearance of the display panel DP together with the window.

A normal direction of the display surface DP-IS, such as a thickness direction of the display panel DP, indicates a third direction DR3. Hereinafter, a front surface (or a top surface) and a rear surface (or a bottom surface) of each of layers or components are distinguished by the third direction DR3.

The display panel DP may include an active area AA and a peripheral area NAA. A pixel PX is disposed on the active area AA, and the pixel PX is not disposed on the peripheral area NAA. The peripheral area NAA is defined along an edge of the display surface DP-IS. The peripheral area NAA may surround the active area AA (e.g., in the first and second directions DR1, DR2). For example, the peripheral area NAA may completely surround the active area AA. However, embodiments of the present inventive concept are not necessarily limited thereto and the peripheral area NAA may be omitted or may not surround one or more sides of the active area AA.

Although the display panel DP having the flat display surface DP-IS is illustrated in FIG. 1A, embodiments of the present inventive concept are not limited thereto. For example, the display panel DP may have a curved display surface or a three-dimensional display surface. The three-dimensional display, surface may include a plurality of display areas indicating different directions from each other.

Referring to FIG. 1B, for example, a display panel DP-A according to an embodiment may be curved along the first direction DR1 based on a virtual axis AX extending in the second direction dR2. However, embodiments of the present inventive concept are not necessarily limited thereto. For example, the axis AX may extend in the first direction DR1 or be curved based on a plurality of axes extending in different directions.

Also, the display panel DP may be a rollable display panel, a foldable display panel, or a slidable display panel. The display panel may have a flexible property to be bent or rolled when installed on a display apparatus. In an embodiment, the display panel DP may be used as a navigation unit disposed in a vehicle.

Referring to FIG. 2, the display panel DP according to an embodiment of the present inventive concept may include a display unit DU and a light control layer OSL. The display unit DU includes a base layer BS, a circuit device layer DU-CL, a display device layer DU-OLED and an encapsulation layer TFL. The display panel OP further includes a light control layer OSL disposed on the display unit DU (e.g., in the third direction DR3). The display panel DP may further include functional layers such as an anti-reflection layer or a refractive index adjusting layer. The circuit device layer DU-CL includes at least a plurality of insulation layers and a circuit device. Hereinafter, the insulation layers may include an organic layer and/or an inorganic layer.

The base layer BS may include a synthetic resin film. The synthetic resin layer may include a thermosetting resin. Although in an embodiment the synthetic resin layer may be a polyimide-based resin layer, embodiments of the present inventive concept are not necessarily limited thereto, and the material of the synthetic resin layer may vary. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In addition, the base layer may include a glass substrate, a metal substrate, or, an organic/inorganic composite substrate.

In an embodiment, the circuit device layer DU-CL provides an insulation layer, a semiconductor layer, and a conductive layer through a process such as coating and deposition. Thereafter, the insulation layer, the semiconductor layer, and the conductive layer may be selectively patterned through a photolithography process and an etching process. Through the above-described processes, a semiconductor pattern, a conductive pattern, and a signal line are provided. Patterns disposed on the same layer are provided through the same process.

The circuit device layer DU-CL include a driving circuit or a signal line of the pixel PX (refer to FIG. 1A). The display device layer DU-OLED may include a light emitting device OLED (refer to FIG. 5A) contained in the pixel PX and a pixel defining layer PDL (refer to FIG. 5A).

The encapsulation layer TFL may be disposed on the display device layer DU-OLED (e.g., in the third direction DR3) to protect the light emitting device OLED. In an embodiment, the encapsulation layer TFL may include inorganic layers and an organic layer disposed between the inorganic layers. The inorganic layers protect the light emitting device OLED from moisture and oxygen, and the organic layer protects the light emitting device OLED from foreign substances such as dust particles.

The light control layer OSL according, to an embodiment of the present inventive concept may selectively block light generated from the light emitting device OLED according to a specific angle. A detailed description thereof will be described later.

The display panel DP may further include a window panel disposed on the light control layer OSL. The window panel may be disposed above the display unit DU and transmit an image provided from the display panel DP to the outside for viewing by a user. In an embodiment, the window panel may include a base layer and a functional layer disposed on the base layer. In an embodiment, the functional layer may include a protection layer and an anti-fingerprint layer. The base layer of the window panel may be made of glass, sapphire, of plastic.

Referring to FIG. 3, the display unit DU may be distinguished into an active area AA and a peripheral area NAA. The active area AA of the display unit DU may be an area on which an image is displayed, and the peripheral area NAA may be an area on which a driving circuit or a driving line are disposed. The light emitting devices of the plurality of pixels PX may be disposed on the active area AA. In an embodiment, the active area AA of the display unit DU may correspond to the active area AA of the display panel DP, and the peripheral area NAA of the display unit. DU may correspond to the peripheral area NAA of the display panel DP.

The display unit DU may include a driving circuit GDC, a plurality of signal lines SGL (hereinafter, referred to as signal lines), a plurality of pixels PX (hereinafter, referred to as pixels), a plurality of contact holes CTN1, CTN2, and CTN3, a plurality of contact lines CTL1, CTL2, and CTL3, and a plurality of pads PD connected to corresponding contact lines and signal lines SGL.

Each of the pixels PX may include a light emitting device and a plurality of transistors connected thereto. The pixels PX may emit light in correspondence to an applied electrical signal.

The signal lines SGL may include scan lines GL, data lines DL, a power line PL, and a control signal line CSL. Each of the scan limes GL may be connected to the corresponding pixel PX of the pixels PX. Each of the data lines DL may be connected to the corresponding pixel PX of the pixels PX. The power line PL may be connected to the pixel PX to provide a power voltage. The control signal line CSL may provide control signals to a scan driving circuit.

The driving circuit GDC may be disposed on the peripheral area NAA. The driving circuit GDC may include the scan driving circuit. The scan driving circuit may generate scan signals and sequentially output the scan signals to the scan lines GL. The scan driving circuit may further output another control signal to the driving circuit of each of the pixels PX.

In an embodiment, the scan driving circuit may include a plurality of thin-film transistors that are provided through the same process as the driving circuit of the pixel PX, e.g., a low temperature polycrystalline silicon (LTPS) process or a low temperature polycrystalline oxide (LTPO) process.

The display unit DU according to an embodiment of the present inventive concept may include a bending area BA and a non-bending area NBA adjacent to the bending area BA (e.g., in the first direction DR1). The bending area BA of the display unit DU may be an area in which a flexible circuit board is attached and bent toward a rear surface of the display unit DU Each of the data lines DL and the signal lines SGL may extend from the non-bending area NBA to the bending area and be connected to the corresponding pad PD.

In an embodiment, a width of the display unit DU in the second direction DR2 may be greater in the non-bending area NBA than in the bending area BA. However, embodiments of the present disclosure are not necessarily limited thereto.

The display unit DU may include the contact holes CTN1, CTN2, and CTN3 defined the peripheral area NAA. The lower contact holes CTN1, CTN2, and CTN3 may overlap upper contact holes CTN-1, CTN-2 and CTN-3 (refer to FIG. 9A) of an input sensor (refer to FIG. 9A) that will be described later.

The contact lines CTL1, CTL2, and CTL3 may extend from the lower contact holes CTN1, CTN2, and CTN3 to the bending area BA and be connected with the corresponding pads PD.

Each of the first contact lines CTL1 may have one end extending to the corresponding first lower contact hole CTN1 and the other end connected to the corresponding pad PD. Each of the second contact lines CTL2 may have one end extending to the corresponding second lower contact hole CTN2 and the other end connected to the corresponding pad PD. Each of the third contact lines CTL3 may have one end extending to the corresponding third lower contact hole CTN3 and the other end connected to the corresponding pad PD.

Although three lower contact holes CTN1, CTN2, and CTN3 are illustrated in FIG. 3, this is merely illustrative. Embodiments of the present inventive concept are not necessarily limited to the arrangement relationship and number of the lower contact holes shown in FIG. 3 as long as the lower contact boles CTN1, CTN2, and CTN3 respectively overlap the upper contact holes CTN-1, CTN-2, and CTN-3 of the input sensor ISL (refer to FIG. 9A). Also, in an embodiment in which the input sensor ISL (refer to FIG. 9A) is not disposed on the display unit DU, the lower contact holes CTN1, CTN2, and CTN3 may be omitted.

FIG. 4 is an enlarged view illustrating an arrangement relationship between light emitting areas PXA-R, PXA-G, and PXA-B disposed on the active area AA of the display unit DU and a light shielding member BM disposed on the light control layer OSL. FIG. 4 illustrates first to third light emitting areas PXA-R, PXA-G, and PXA-B respectively contained in first to third pixel rows PXL1, PXL2, and PXL3 as an example. However, embodiments of the present disclosure are not necessarily limited thereto and the number of light emitting areas and arrangement thereof may vary. The first to third light emitting areas PXA-R, PXA-G, and PXA-B may be repeatedly arranged over the entire active area AA (refer to FIG. 1A).

According to an embodiment, the first to third light emitting areas PXA-R, PXA-G, and PXA-B arranged in the first direction DR1 may provide light having different colors. The light emitting areas arranged in the second direction DR2 may provide light having the same color.

However, embodiments of the present inventive concept are not necessarily limited thereto. For example, in an embodiment the light emitting areas arranged in the first direction DR1 may provide light having the same color, and the light emitting areas arranged in the second direction DR2 may provide light having different colors.

The light shielding member BM of the light control layer OSL may be disposed on the display unit DU (refer to FIG. 3). The light shielding member BM may define a plurality of light shielding openings BM-OP passing therethrough in the third direction DR3. In an embodiment, the light shielding openings BM-OP may one-to-one correspond to the first to third light emitting areas PXA-R, PXA-G, and PXA-B. Thus, the light shielding member BM may have a grid shape on a plane.

According to an embodiment of the present inventive concept, the first to third light emitting areas PXA-R, PXA-G, and PXA-B from which light generated from the light emitting deice OLED (refer to FIG. 5A) is substantially emitted may be defined by the light shielding openings BM-OP. A non-light emitting area NPXA adjacent to the first to third pixel areas PXA-R, PXA-G, and PXA-B may be defined as an area on which the light shielding member BM is disposed.

The light shielding member BM according to an embodiment may include a first portion PP1 and a second portion PP2. Although the first portion PP1 and the second portion PP2 are substantially integrated with each other, the first portion PP1 and the second portion PP2 will be distinguished for convenience of description.

In an embodiment, the first portion PP1 may be defined as a portion of the light shielding member BM disposed between adjacent light emitting areas arranged in the second direction DR2 (e.g., a column direction). The second portion PP2 may be defined as a portion of the light shielding member BM disposed between adjacent light emitting areas arranged in the first direction DR1 (e.g., a row direction).

Referring to FIGS. 5A and 5B, the display panel DP may include the display unit DU and the light control layer OSL. The display unit DU includes the base layer BS, the circuit device layer DU-CL, the display device layer DU-OLED, the encapsulation layer TFL, and the light control layer OSL. The display unit DU may correspond to the display unit DU described in FIG. 2.

A plurality of transistors may be disposed on the circuit device layer DU-CL. In an embodiment, the transistors may be provided through a low temperature polycrystalline silicon (LTPS) process or a low temperature polycrystalline oxide (LTPO) process.

The display device layer DU-OLED includes the light emitting device OLED and a pixel defining layer PDL. For example, the pixel defining layer PDL may be an organic layer. The light emitting device OLED includes a first electrode AE, a light emitting layer EML and a second electrode CE.

The pixel defining layer PDL is disposed on the circuit device layer DU-CL A display opening PD-OP is defined in a pixel defining layer PDL. The display opening PD-OP exposes at least a portion of the first electrode AE. For example, as shown in FIG. 5A, in an embodiment, the display opening PD-OP may expose a central portion of the first electrode AE (e.g., in the first direction DR1). However, embodiments of the present inventive concept are not necessarily limited thereto. In an embodiment, the pixel defining layer PDL may have a black color. The pixel defining layer PDL may include a black coloring agent. The pixel defining layer PDL may include a black dye and a black pigment mixed in a base resin. The light emitting layer EML is disposed on the first electrode AE (e.g., in the third direction DR3). The light emitting layer EML may be disposed on an area corresponding to the display opening PD-OP. The second electrode CE is disposed on the light emitting layer EML (e.g., in the third direction DR3). In an embodiment, the second electrode CE may be disposed in the plurality of pixels in common. The light emitting device OLED may cover the display device layer DU-OLED The light emitting device OLED according to an embodiment may further include at least one of a hole control layer disposed between the first electrode AE and the light emitting layer EML (e.g., in the third direction DR3) and an electron control layer disposed between the light emitting layer EML and the second electrode CE (e.g., in the third direction DR3).

The light control layer OSL may include the light shielding member BM and a cover layer CV.

In an embodiment, the light shielding member BM may be disposed on the encapsulation layer TFL (e.g., in the third direction DR3). For example, in an embodiment, the light shielding member BM may contact an inorganic layer disposed at an uppermost layer of the encapsulation layer TFL. The cover layer CV may be disposed on the encapsulation layer TFL to cover the light shielding member BM.

However, embodiments of the present inventive concept are not necessarily limited thereto and the cover layer CV may vary. For example, the cover layer CV may include all sorts of cover layers containing an organic material and/or an inorganic material. The light control layer OSL according to an embodiment may further include an additional cover layer disposed on the cover layer CV and containing an inorganic material.

On a cross-section, the first portion PP1 of the light shielding member BM disposed between the light emitting areas spaced apart from each other in the second direction may include a first partition wall P1 and a second partition wall P2.

In an embodiment, a first edge EG1 may be defined as a corner of the first partition wall P1 adjacent to one light-emitting area (e.g., in the second direction DR2), such as a first light emitting area PXA-R, and a second edge EG2 may be defined as a corner disposed farthest from the first edge EG1 in the second direction DR2 among corners of the second partition wall P2.

The first partition wall P1 may have a first thickness TH1 in the third direction DR3. The second partition wall P2 may have a second thickness TH2 in the third direction DR3. The first thickness TH1 may be less than the second thickness TH2. In this embodiment, an angle between the first partition wall P1 and the second partition wall P2 may be a right angle.

In an embodiment, in the light shielding member BM, a portion having the first thickness TH1 may be obtained by reducing the thickness of a portion having the second thickness TH2 by irradiating the portion with a different transmittance through a half-tone mask.

In an embodiment, in the light shielding member BM, the second portion PP2 disposed between the first to third light emitting areas PXA-R, PXA-G, and PXA-B spaced apart from each other in the first direction DR1 may have the same first thickness TH1 as the first partition wall P1.

Thus, in the light shielding member BM, the first portion PP1 disposed between the first light emitting area PXA-R of the first pixel row PXL1 (refer to FIG. 4) and the first light emitting area PXA-R of the second pixel row PXL2 (refer to FIG. 4) spaced in the second direction DR2 (the row direction) may have the first thickness TH1 at the first edge EG1 adjacent to the first light emitting area PXA-R of the first pixel row PXL1 and the second thickness TH2 at the second edge EG2 adjacent to the first light emitting area PXA-R of the second pixel row PXL2.

Also, in the light shielding member BM, the second portion PP2 disposed between the first light emitting area PXA-R of the first pixel row PXL1 and the second light emitting area PXA-G of the first pixel row PXL1 spaced apart in the first direction DR1 (the row direction) may have the first thickness TH1.

In FIG. 4, for convenience of explanation, the area having the second thickness TH2 in the light shielding member BM is hatched by a dark color, and the area having the first thickness TH1 in the light shielding member BM is hatched by a pale color. As illustrated in FIG. 4, the portion having the second thickness TH2 in the light shielding member BM may extend in the first direction DR1 and is arranged along the second direction DR2. The portion having the second thickness TH2 in the light shielding member BM may be adjacent to one side surface of each of the first to third pixel areas PXA-R, PXA-G, and PXA-B, and the portion having the first thickness TH1 in the light shielding member BM may be adjacent to the other side surface of each of the first to third pixel areas PXA-R, PXA-G, and PXA-B. For example, in an embodiment of FIG. 4, the portion having the second thickness TH2 is adjacent to an upper side surface (e.g., in the second direction DR2) of the first to third pixel areas PXA-R, PXA-G, and PXA-B and the portion having the first thickness TH1 is adjacent to a lower side surface (e.g., in the second direction DR2) of the first to third pixel areas PXA-R, PXA-G, and PXA-B. However, embodiments of the present disclosure are not necessarily limited thereto.

The light shielding member BM according to an embodiment of the present inventive concept may block light provided at a specific angle because the inner surfaces surrounding the side surfaces of each of the first to third pixel areas PXA-R, PXA-G, and PXA-B have different thicknesses.

For example, as illustrated in FIG. 5B, light emitted to a first path L1 of the light generated from the light emitting device OLED may be provided to the display surface DP-IS (refer to FIG. 1A) without interference of the light shielding member BM. However, light emitted to a second path L2 may be blocked by the second partition wall P2 having the second thickness TH2. Thus, an amount of the light emitted in a direction toward the second partition wall P2 of the light generated from the light emitting device OLED may decrease.

According to an embodiment of the present inventive concept, the light shielding member BM may block light provied at a specific angle and simultaneously prevent color mixture between the adjacent light emitting areas providing light having different colors.

Figure 6:
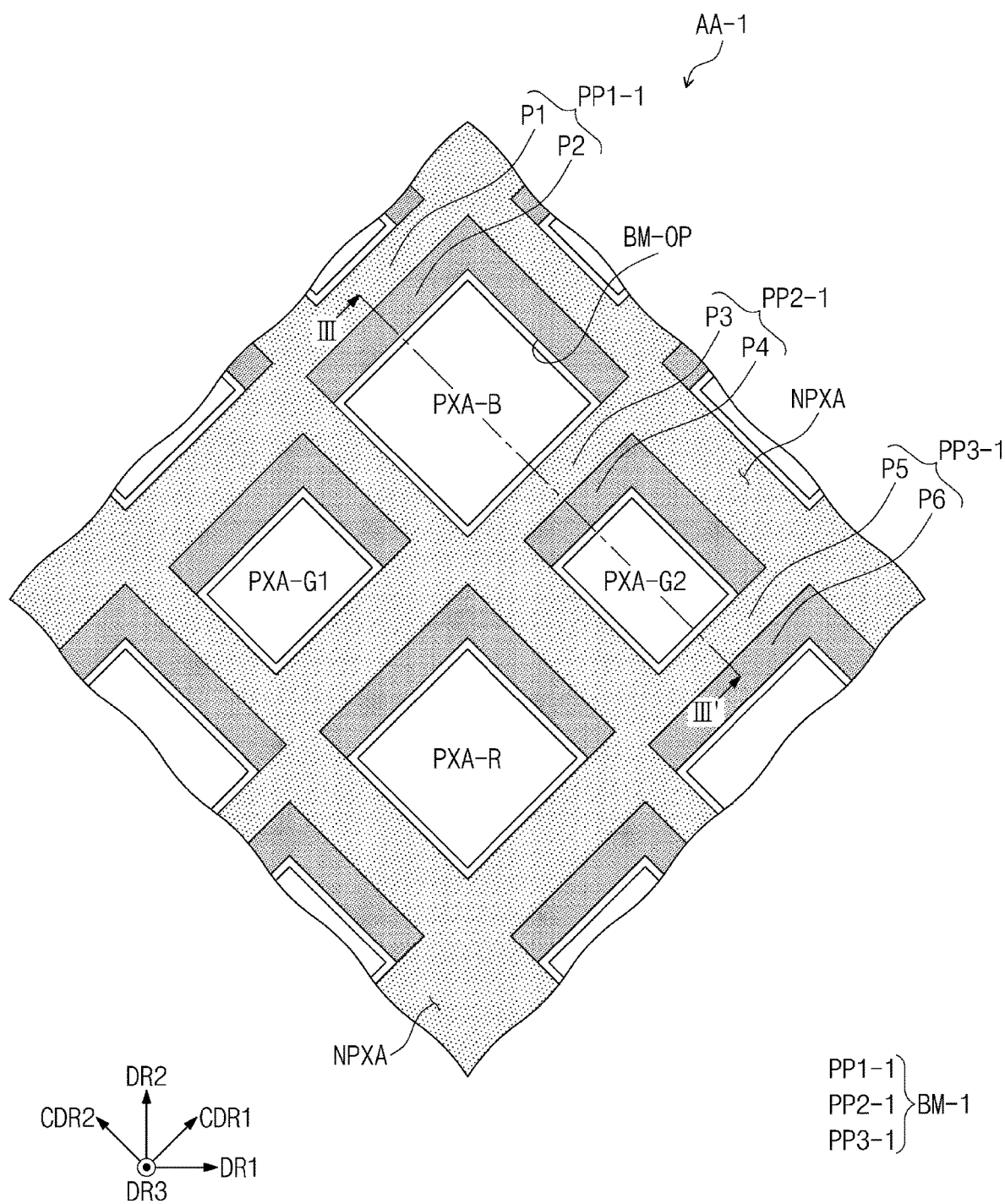
FIG. 6 is an enlarged view illustrating the active area according to an embodiment of the present inventive concept.
Figure 7:
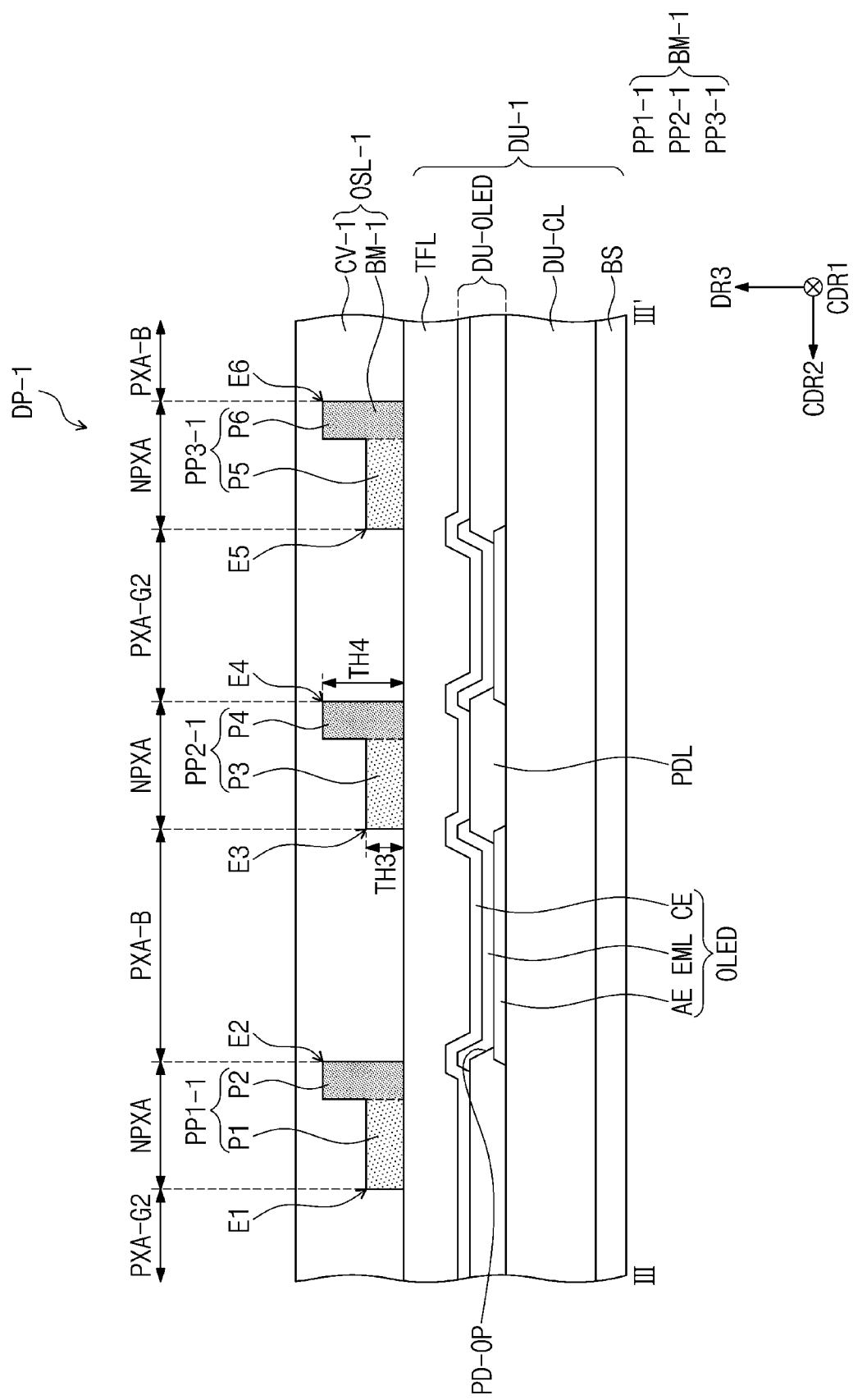
FIG. 7 is a cross-sectional view taken along line III-III' of FIG. 6 according to an embodiment of the present inventive concept.

FIG. 6 is an enlarged view illustrating an active area according to an embodiment of the present inventive concept. FIG. 7 is a cross-sectional view taken along line III-III' of FIG. 6. The same or similar components as those described in FIGS. 4 to 5B will be designated by the same or similar reference numerals, respectively, and an overlapped description thereof will be omitted.

Referring to FIG. 6, an active area AA-1 according to this embodiment may include first to third light emitting areas PXA-B, PXA-G1, PXA-G2, and PXA-R having different surface areas and a non-light emitting area NPXA. The first to third light emitting areas PXA-B, PXA-G1, PXA-G2, and PXA-R may be defined as one unit pixel in the active area AA-1, and the unit pixel may be repeatedly arranged over the entire active area AA-1. The arrangement of the light emitting areas in FIG. 6 may be referred to as a Pen-Tile structure.

A first light emitting area PXA-B may have a largest surface area on a plane defined in a first diagonal direction CDR1 and a second diagonal direction CDR2. In an embodiment, each of the first diagonal direction CDR1 and the second diagonal direction CDR2 may be crossing the first and second directions DR1, DR2 and perpendicular to the third direction DR3.

One unit pixel may include a second-one light emitting area PXA-G1 and a second-two light emitting area PXA-G2 providing light having the same color. In an embodiment, the second-one light emitting area PXA-G1 and the second-two light emitting area PXA-G2 may have the same surface area that is a smallest surface area of the first to third light emitting areas PXA-B, PXA-G1, PXA-G2, and PXA-R.

The second-one light emitting area PXA-G1 and the second-two light emitting area PXA-G2 may be spaced apart from each other in the first direction DR1. The second-one light emitting area PXA-G1 may be spaced apart from the first light emitting area PXA-B in the first diagonal direction CDR1 and spaced apart from the third light emitting area PXA-R in the second diagonal direction CDR2. The second-two light emitting area. PXA-G2 may be spaced apart from the first light emitting area PXA-B in the second diagonal direction CDR2 and spaced apart from the third light emitting, area PXA-R in the first diagonal direction CDR1.

The second light emitting area PXA-R may be spaced apart from the first emitting area PXA-R in the second direction DR2.

In an embodiment, light shielding openings BM-OP that one-to-one correspond to the first to third light emitting areas PXA-B, PXA-G1, PXA-G2, and PXA-R may be defined in a light shielding member BM-1. Each of the light shielding openings BM-OP may include inner surfaces of the light shielding member BM-1.

In an embodiment, each of the inner surfaces adjacent to two side surfaces of four side surfaces of each of the first to third light emitting areas PXA-B, PXA-G1 PXA-G2, and PXA-R may have a thickness greater than that of each of the remaining inner surfaces on a cross-section in the light shielding member BM-1.

For example, in an embodiment each of the inner surfaces adjacent to one side surface extending in the first diagonal direction CDR1 and the other side surface extending in the second diagonal direction CDR2 may have a thickness greater than that of each of the rest side surfaces. However, embodiments of the present disclosure are not necessarily limited thereto.

Referring to FIG. 7, a display panel DP-1 may include a display unit DU-1 and a light control layer OSL-1. A base substrate BS, a circuit device layer DU-CL, a display device layer DU-OLED, and an encapsulation layer TFL of the display unit DU-1 may correspond to those of the display unit DU described in FIG. 2.

According to an embodiment, a first portion PP1-1 of the light shielding member BM-1 may be defined a portion disposed between the second-two light emitting area PXA-G2 and the first light emitting area PXA-B of an adjacent unit pixel.

The first portion PP1-1 may include a first partition wall P1 adjacent to the second-two light emitting area PXA-G2 of the adjacent unit pixel and a second partition wall P2 adjacent to the first light emitting area PXA-B of the adjacent unit pixel.

A first edge E1 may be defined as a corner of the first partition wall P1, and a second edge E2 may be defined as a corner disposed farthest from the first edge E1 in the second diagonal direction CDR2 among corners of the second partition wall P2. The first edge E1 may have a third thickness TH3, and the second edge E2 may have a fourth thickness TH4 greater than the third thickness TH3.

The second portion PP2-1 of the light shielding member BM-1 may be defined as a portion facing the first portion PP1-1 in the second diagonal direction CDR2 and disposed between the first light emitting area PXA-B and the second-two light emitting area PXA-G2, which are contained in the same pixel unit.

The second portion PP2-1 may include a third partition wall P3 adjacent to the first light emitting area PXA-B and a fourth partition wall P4 adjacent to the second-two light emitting area PXA-G2.

A third edge E3 may be defined as a corner of the third partition wall P3 adjacent to the first light emitting area PXA-B (e.g., in the second diagonal direction CDR2), and a fourth edge E4 may be defined as a corner disposed farthest from the third edge E3 in the second diagonal direction CDR2 among, corners of the fourth partition wall P4. The fourth edge E4 may be adjacent to the second-two light emitting area PXA-G2 (e.g., in the second diagonal direction CDR2). The third edge E3 may have the third thickness TH3, and the fourth edge E4 may have the fourth thickness TH4 greater than the third thickness TH3.

The third portion PP3-1 of the light shielding member BM-1 may be defined as a portion facing the second portion PP2-1 in the second diagonal direction CDR2 and disposed between the second-two light emitting area PXA-G2 and the first light emitting area PXA-B of the adjacent unit pixel.

The third portion PP3-1 may include a fifth partition wall P5 adjacent to the second-two light emitting area PXA-G2 and a sixth partition wall P6 adjacent to the first light emitting area PXA-B of the adjacent unit pixel.

A fifth edge E5 may be defined as a corner of the fifth partition wall P5 adjacent to the second-two light emitting area PXA-G2, and a sixth edge E6 may be defined as a corner disposed farthest from the fifth edge E5 in the second diagonal direction CDR2 among corners of the sixth partition wall P6. The sixth edge E6 may be adjacent to the first light emitting area PXA-B of the adjacent unit pixel. The fifth edge E5 may have the third thickness TH3, and the sixth edge E6 may have the fourth thickness TH4 greater than the third thickness TH3.

According to an embodiment, two side surfaces of each of the first to third light emitting areas PXA-B, PXA-G1, PXA-G2, and PXA-R may be adjacent to the portion having the fourth thickness TH4 among inner surfaces of the light shielding member BM-1, and the remaining two side surfaces of each of the first to third light emitting areas PXA-B, PXA-G1, PXA-G2, and PXA-R may be adjacent to the portion having the third thickness TH3 among the inner surfaces of the light shielding member BM-1 on a cross-section. Thus, light provided to the light shielding member BM-1 having the fourth thickness TH4 may be blocked at a specific angle.

Figure 8:
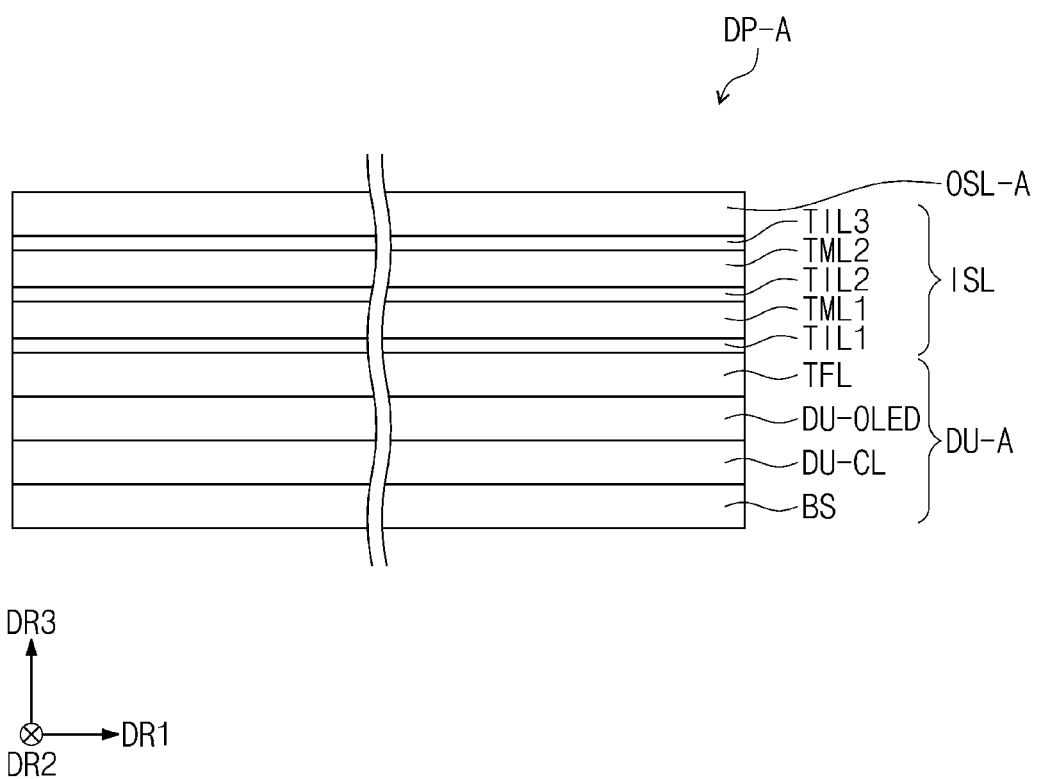
FIG. 8 is a cross-sectional view illustrating a display panel according to an embodiment of the present inventive concept.
Figure 9A:
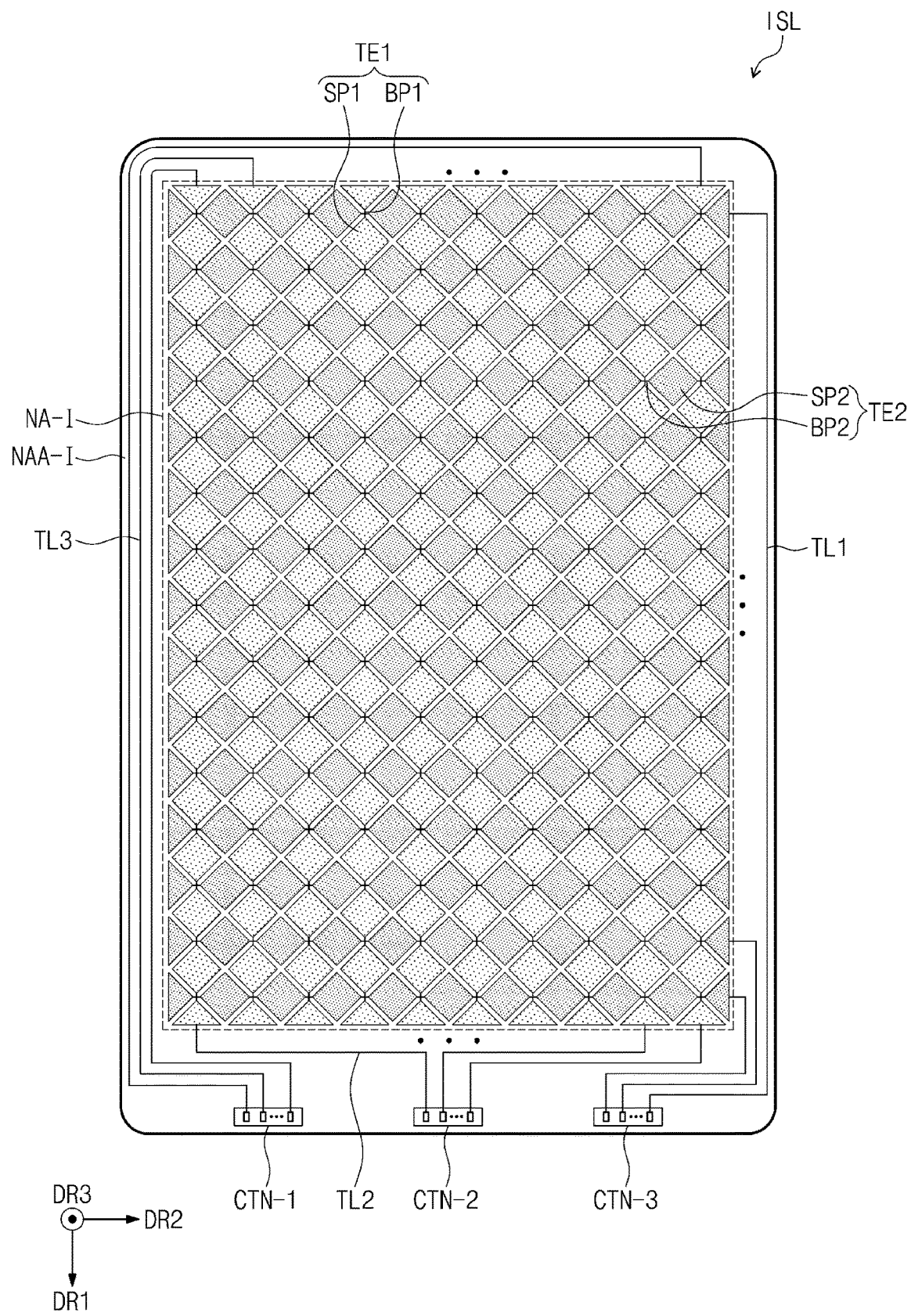
FIG. 9A is a plan view illustrating an input sensor according to an embodiment of the present inventive concept.

FIG. 8 is a cross-sectional view illustrating a display panel according to an embodiment of the present inventive concept. FIG. 9A is a plan view illustrating an input sensor according to an embodiment of the present inventive concept. FIG. 9B is a cross-sectional view illustrating the display panel according to an embodiment of the present inventive concept. The same or similar components as those described in FIGS. 2 to 5B will be designated by the same or similar reference numerals, respectively, and an overlapped description thereof will be omitted.

Referring to FIG. 8, a display panel DP-A may include a display unit DU-A, an input sensor ISL, and a light control layer OSL-A. The display unit DU-A may correspond to the display unit DU described in FIGS. 2 to 5B. In an embodiment, the input sensor ISL may be disposed on the display unit DU-A (e.g., in the third direction DR3), and the light control layer OSL-A may be disposed on the input sensor ISL (e.g., in the third direction DR3).

In this embodiment, the input sensor ISL is disposed on the display unit DU-A. In an embodiment, the input sensor ISL may be provided on the display unit DU-A through a continuous process. In this embodiment, it may be expressed that the input sensor ISL is 'directly disposed' on the display unit DU-A. The feature of being 'directly disposed' may represent that a third component is not disposed between the input sensor ISL and the display unit DU-A. For example, a separate adhesive member is not disposed between the input sensor ISL and the display unit DU-A (e.g., in the third direction DR3).

In an embodiment, the input sensor ISP may sense an external input by one of a self-capacitance type method and a mutual capacitance type method. Sensing patterns contained in the input sensor ISP may be various deformed, and arranged and connected appropriately to the method.

In an embodiment, the input sensor ISP may include a first sensing insulation layer TIL1, a first conductive layer TML1, a second sensing insulation layer TIL2, a second conductive layer TML2, and a third sensing insulation layer TIL3. The first sensing insulation layer TIL1 of the input sensor ISP may be directly disposed on a thin-film encapsulation layer TFL (e.g., in the third direction DR3). However, embodiments of the present disclosure are not necessarily limited thereto. For example, in an embodiment the first sensing insulation layer TIL1 may be omitted and the first conductive layer TML1 may be directly disposed on the thin-film encapsulation layer TFL.

Each of the first conductive layer TML1 and the second conductive layer TML2 may have a single layer structure or a multilayer structure. The conductive layer of the multilayer structure may include at least two of transparent conductive layers and metal layers. The conductive layer having the multilayer structure may include metal layers including different metal from each other.

In an embodiment, each of the first conductive layer TML1 and the second conductive layer TML2 that are transparent conductive layers may include at least one of an indium tin oxide (ITO), an indium zinc oxide (IZO), a zinc oxide (ZnO), an indium tin zinc oxide (ITZO), PEDOT, a metal nano wire, and a graphene. Each of the first conductive layer TML1 and the second conductive layer TML2 that are metal layers may include molybdenum, silver, titanium, copper, aluminum, and an alloy thereof.

For example, each of the first conductive layer TML1 and the second conductive layer TML2 may have a three layer structure of titanium/aluminum/titanium. Metal having a relatively high durability and a relatively low reflectance may be applied to an outer layer of the conductive layer, and metal having a high electrical conductivity may be applied to an inner layer of the conductive layer.

Each of the first sensing insulation layer TIL1 to the third sensing insulation layer TIL3 may include an inorganic layer or an organic layer. In an embodiment, each of the first sensing insulation layer TIL1 and the second sensing insulation layer TIL2 may include an inorganic layer. The inorganic layer may include at least one of an aluminum oxide, a titanium oxide, a silicon oxide, a silicon oxide nitride, a zirconium oxide, or a hafnium oxide.

The third sensing insulation layer TIL3 may include an organic layer. In an embodiment, the organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Referring to FIG. 9A, in an embodiment, the input sensor ISL may include a plurality of sensing electrodes TE1 and TE2 and a plurality of sensing lines TL1, TL2, and TL3.

The input sensor ISL may include an active area AA-I sensing an external input and a peripheral area NAA-I disposed adjacent to the active area AA-I. The active area AA-I and the peripheral area NAA-I of the input sensor ISL may correspond to the active area AA (refer to FIG. 3) and the peripheral area NAA (refer to FIG. 3) of the display unit DU-A.

The plurality of sensing electrodes TE1 and TE2 may include a first sensing electrode TE1 and a second sensing electrode TE2.

A plurality of first sensing electrodes TE1 may each extend in the first direction DR1 and be arranged in the second direction DR2. The first sensing electrodes TE1 may include first sensing patterns SP1 and first conductive patterns BP1. The first sensing patterns SP1 may be arranged in the first direction DR1. At least one first conductive pattern BP1 may be connected to two adjacent first sensing patterns SP1

A plurality of second sensing electrodes TE2 may each extend in the second direction DR2 and be arranged in the first direction DR1. The second sensing electrodes TE2 may include second sensing patterns SP2 and second conductive patterns BP2. Although in an embodiment the second sensing patterns SP2 and second conductive patterns BP2 have an integrated shape patterned by the same process, the second sensing patterns SP2 and second conductive patterns BP2 are distinguished for convenience of description.

The second sensing patterns SP2 may be arranged in the second direction DR2. At least one second conductive pattern BP2 may be disposed between the two adjacent second sensing patterns SP2.

In an embodiment, the sensing lines TL1, TL2, and TL3 may include a first sensing line TL1, a second sensing line TL2, and a third sensing line TL3.

The input sensor ISL according to an embodiment of the present inventive concept may include a plurality of upper contact holes CTN-1, CTN-2, and CTN-3 defined in the peripheral area NAA-I. The upper contact holes CTN-1, CTN-2, and CTN-3 may pass through the first sensing insulation layer TIL1 and the second sensing insulation layer TIL2. The upper contact holes CTN-1, CTN-2, and CTN-3 may respectively overlap the corresponding lower contact holes CTN1, CTN2, and CTN3 (refer to FIG. 3).

The first sensing line TL1 may have one end connected to the second sensing electrode TE2 and the other end extending to the third upper contact hole CTN-3. The other end of the first sensing line TL1 may be connected with the third contact line CTL3 (refer to FIG. 3) through the third lower contact hole CTN3 (refer to FIG. 3) and the third upper contact hole CTN-3, which overlap each other (e.g., in the third direction DR3).

The second sensing line TL2 may have one end connected to one end of the first sensing electrode TE1 and the other end extending to the second upper contact hole CTN-2. The other end of the second sensing line TL2 may be connected with the second contact line CTL2 (refer to FIG. 2) through the second lower contact hole CTN2 (refer to FIG. 2) and the second upper contact hole CTN-2, which overlap each other (e.g., in the third direction DR3).

The third sensing line TL3 may have one end connected to the other end of the first sensing electrode TE1 and the other end extending to the first upper contact hole CTN-1. The other end of the third sensing line TL3 may be connected with the first contact line CTL1 (refer to FIG. 3) through the first lower contact hole CTN1 (refer to FIG. 3) and the first upper contact hole CTN-1, which overlap each other (e.g., in the third direction DR3).

The first sensing electrode TE1 according to an embodiment of the present inventive concept may be connected to the second sensing line TL2 and the third sensing line TL3. Thus, sensitivity based on an area with respect to the first sensing electrode TE1 having a relatively greater length than the second sensing electrode TE2 may be uniformly maintained.

Referring to FIG. 9B, the light control layer OSL-A according to an embodiment of the present inventive concept may include a light shielding member BM-A disposed on the input sensor ISL and a cover layer CV-A covering the light shielding member BM-A.

In an embodiment, the light shielding member BM-A may include first to third portions PP1-A, PP2-A, and PP3-A. The first portion PP1-A may include a first partition wall P1 and a second partition wall P2. The second portion PP2-A may include a third partition wall P3 and a fourth partition wall P4. The third portion PP3-A may include a fifth partition wall P5 and a sixth partition wall P6. The first to third portions PP1-A, PP2-A, and PP3-A of the light shielding member BM-A may correspond to the first to third portions PP1-1, PP2-1, and PP3-1 of the light shielding member BM-1 described in FIG. 7.

Figure 10A:
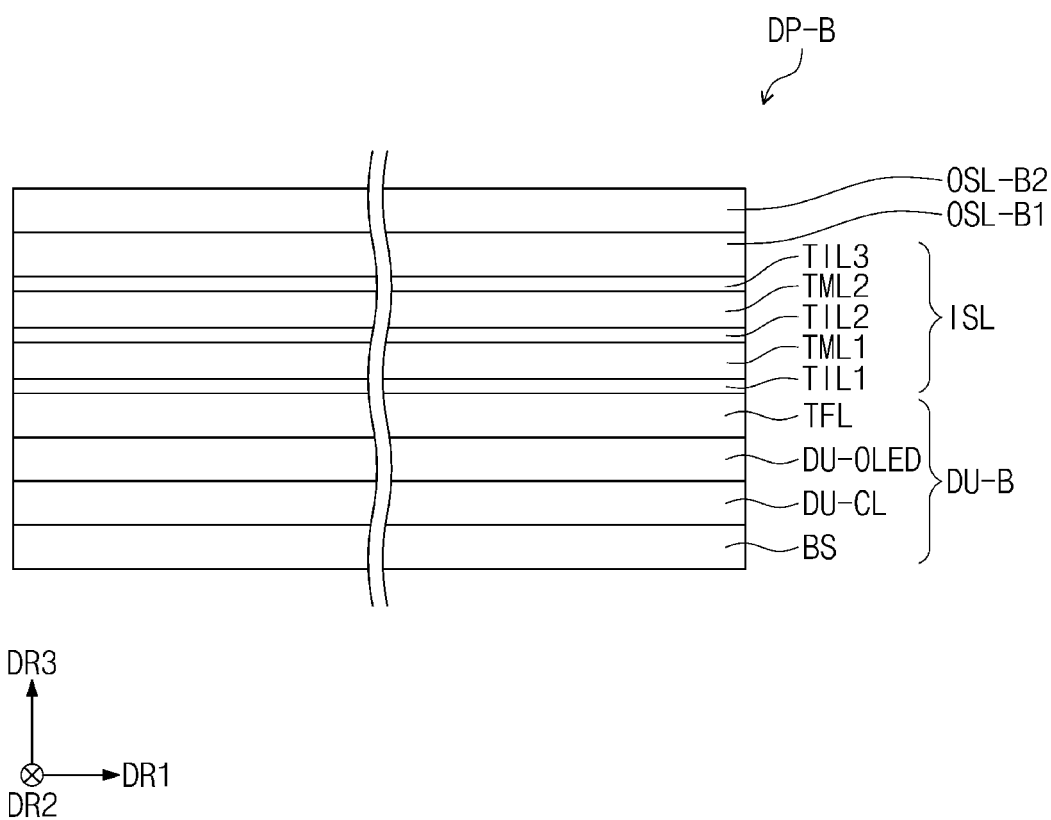
FIG. 10A is a cross-sectional view illustrating a display panel according to an embodiment of the present inventive concept.
Figure 10B:
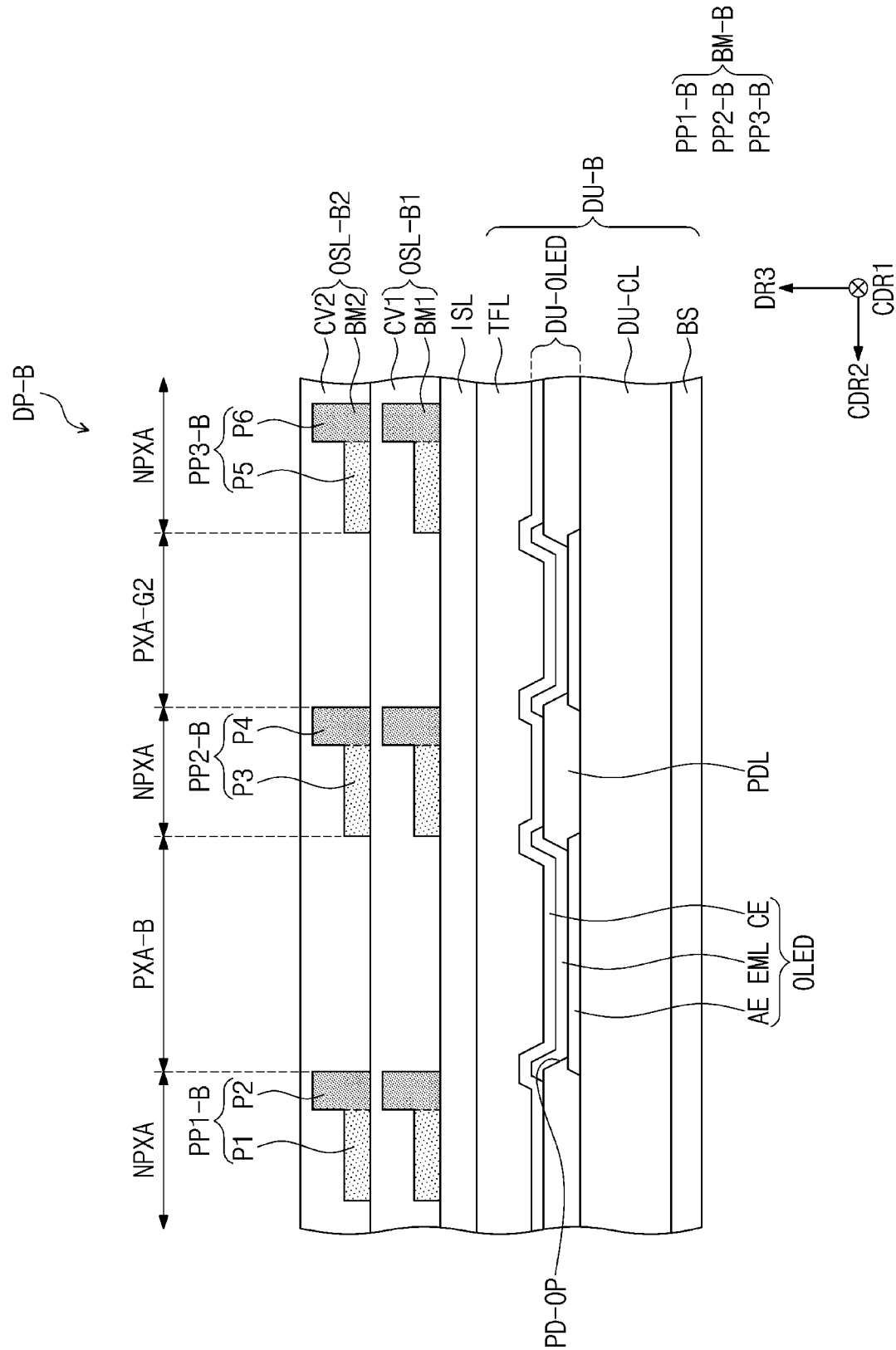
FIG. 10B is a cross-sectional view illustrating the display panel according to an embodiment of the present inventive concept.

FIG. 10A is a cross-sectional view illustrating a display panel according to an embodiment of the present inventive concept. FIG. 10B is a cross-sectional view illustrating the display panel according to an embodiment of the present inventive concept. The same or similar components as those described in FIGS. 2 to 5B and FIGS. 8 to 9B will be designated by the same or similar reference numerals, respectively, and an overlapped description thereof may be omitted for convenience of explanation.

Referring to FIG. 10A, a display panel DP-B may include a display unit DU-A, an input sensor ISL, a first light control layer OSL-B1, and a second light control layer OSL-B2. The display unit DU-B may correspond to the display unit DU described in FIGS. 2 to 5B, and the input sensor ISL may correspond to the input sensor ISL described in FIGS. 8 and 9A.

In an embodiment, the first light control layer OSL-B1 may be disposed on the input sensor ISL (e.g., in the third direction DR3), and the second light control layer OSL-B2 may be disposed on the first light control layer CSL-B1 (e.g., in the third direction DR3). In an embodiment, the first light control layer OSL-B1 may include a first light shielding member BM1 and a first cover layer CV1. The second light control layer OSL-B2 may include a second light shielding member BM2 (e.g., an additional light shielding member) and a second cover layer CV2 (e.g., an additional cover layer).

Referring to FIG. 10B, each of the first light shielding member BM1 and the second light shielding member BM2 may include first to third portions PP1-B, PP2-B, and PP3-B. The first portion PP1-B may include a first partition wall P1 and a second partition wall P2. The second portion PP2-B may include a third partition wall P3 and a fourth partition wall P4. The third portion PP3-B may include a fifth partition wall P5 and a sixth partition wall P6.

The first to third portions PP1-B, PP2-B, and PP3-B may correspond to the first to third portions PP1-1, PP2-1, and PP3-1 of the light shielding member. BM-1 described in FIG. 7.

According to an embodiment, as the double light shielding members are arranged, the display panel DP-B may have a narrow viewing angle.

Figure 11:
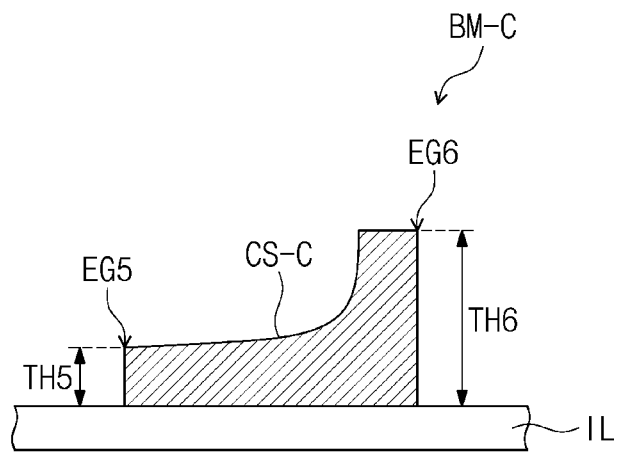
FIG. 11 is a cross-sectional view illustrating a light shielding member according to an embodiment of the present inventive concept.
Figure 12:
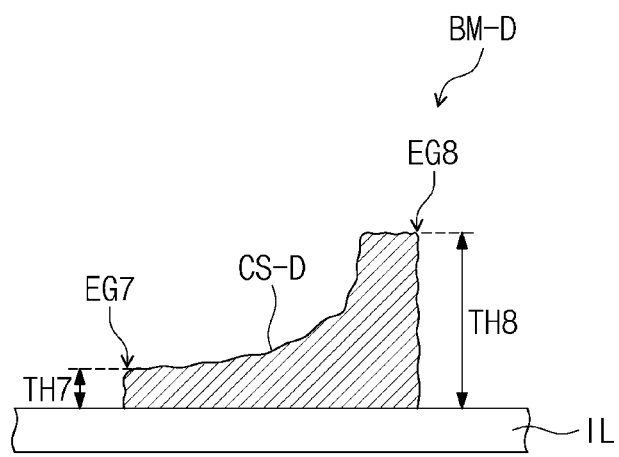
FIG. 12 is a cross-sectional view illustrating a light shielding member according to an embodiment of the present inventive concept.

FIG. 11 is a cross-sectional view illustrating a light shielding member according to an embodiment of the present inventive concept. FIG. 12 is a cross-sectional view illustrating a light shielding member according to an embodiment of the present inventive concept. The same or similar components as those described in FIGS. 4 to 5B will be designated by the same or similar reference numerals, respectively, and an overlapped description thereof may be omitted for convenience of explanation.

An insulation layer IL in FIGS. 11 and 12 may correspond to the uppermost insulation layer contained in the encapsulation layer TFL (refer to FIG. 5A) of the display unit DU (refer to FIG. 5A) or the third sensing insulation layer TIL3 contained in the input sensor ISL in FIG. 8.

Referring to FIG. 11, a light shielding member BM-C according to an embodiment may include a first edge EG5 and a second edge EG6 having different thicknesses from each other on a cross-section. A portion adjacent to the first edge EG5 may have a first thickness TH5 less than a second thickness TH6 of a portion adjacent to the second edge EG6. Thus, light emitted to a side surface adjacent to the second edge EG6 among side surfaces of a light emitting area may be blocked by the portion having the second thickness TH6 of the light shielding member BM-C.

According to an embodiment, a side surface CS-C connecting the first edge EG5 and the second edge EG6 may include a curved surface having a thickness varying from the first thickness TH5 to the second thickness TH6. The shape of the curved surface of the side surface CS-C shown in FIG. 11 is not necessarily limited thereto and the curved surface may have various different shapes from the first edge EG5 to the second edge EG6.

Referring to FIG. 12, a light shielding member BM-D according to an embodiment may include a first edge EG7 and a second edge EG8 having different thicknesses from each other on a cross-section. A portion adjacent to the first edge EG7 may have a first thickness TH7 less than a second thickness TH8 of a portion adjacent to the second edge EG8. Thus, light emitted to a side surface adjacent to the second edge EG8 among side surfaces of a light emitting area may be blocked by the portion having the second thickness TH8 of the light shielding member BM-D.

According to an embodiment, a curved surface CS-D connecting the first edge EG7 and the second edge EG8 in the light shielding member BM-D may include an uneven surface. For example, the curved surface CS-D having an uneven surface is a curved surface having an irregular shape). This may be generated according to a difference of a curing degree in a process of patterning the light shielding member BM-D using a half tone mask.

Figure 13A:
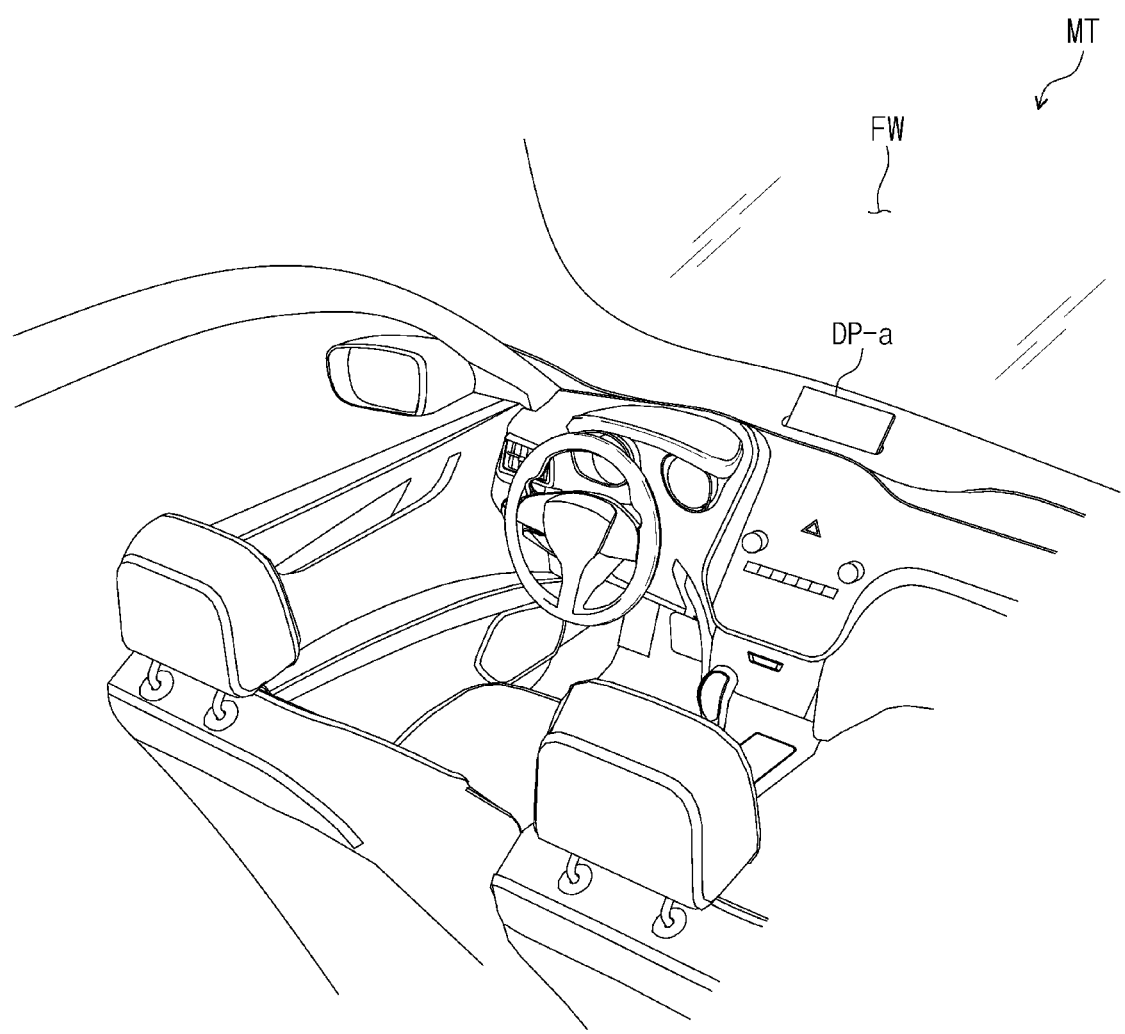
FIGS. 13A and 13B are a perspective view and a partial side view, respectively, illustrating a usage example of the display panel according to embodiments of the present inventive concept.
Figure 13B:
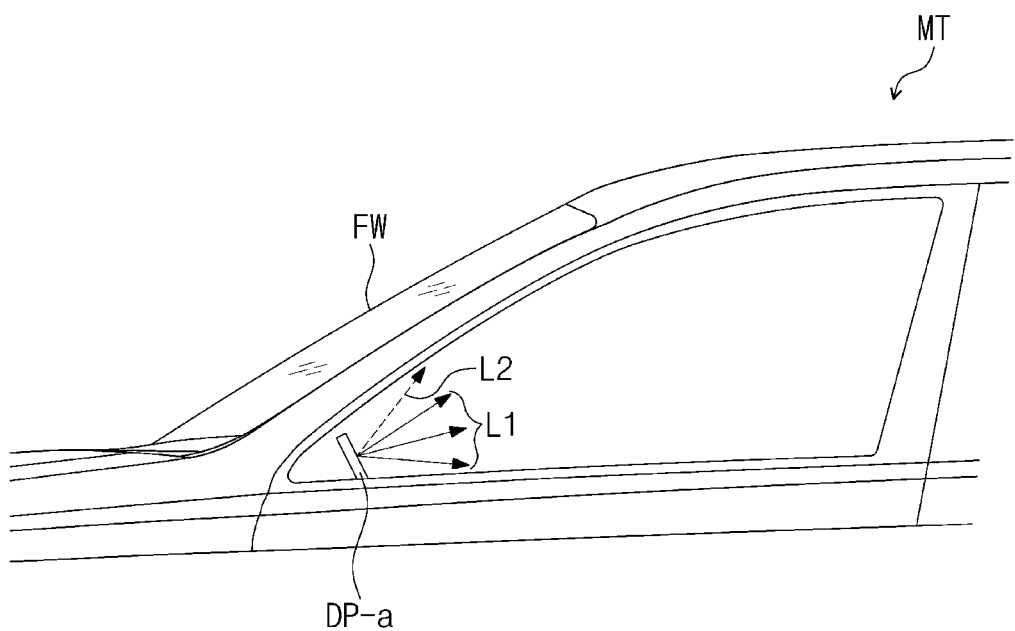
Figure 14A:
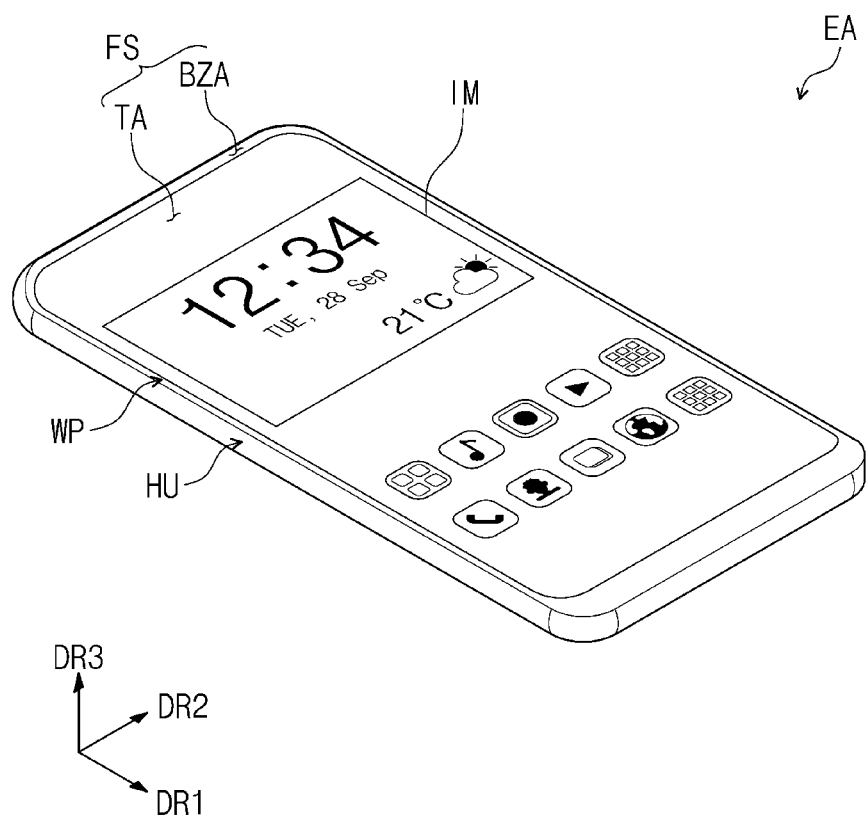
FIGS. 14A and 14B are a perspective view and an exploded view illustrating a usage example of the display panel according to embodiments of the present inventive concept.
Figure 14B:
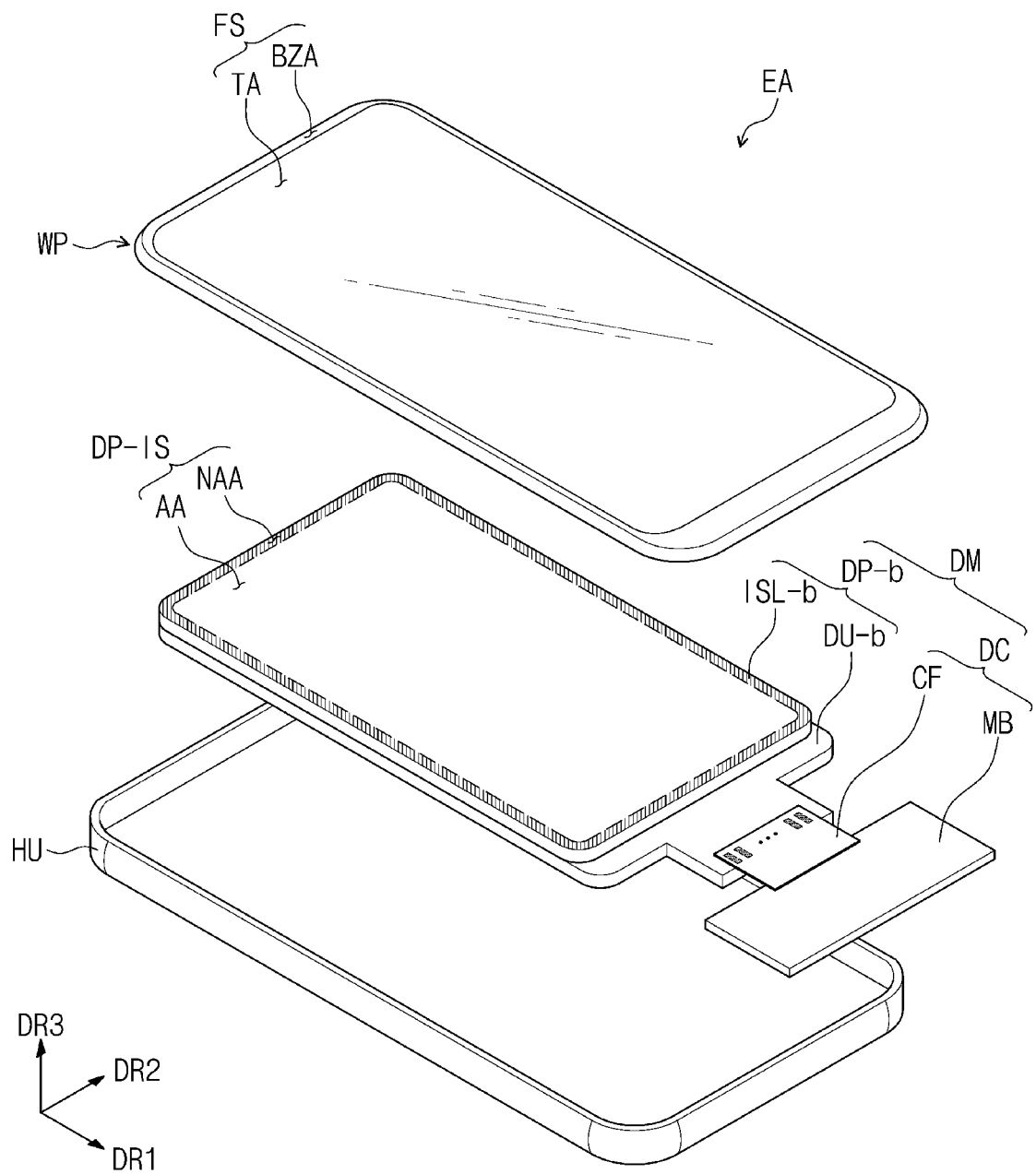

FIGS. 13A and 13B are views illustrating a usage example of a display panel according to embodiments of the present inventive concept. FIGS. 14A and 14B are views illustrating a usage example of a display panel according to embodiments of the present inventive concept.

A display panel DP-a and DP-b in FIGS. 13a to 14b may correspond to any one of the display panel DP, DP-1, DP-A, and DP-B and show a substantial usage example of the display panel according to embodiments of the present inventive concept. Also, embodiments related to a light shielding member may be applied to the display panel DP-a and DP-b in FIGS. 13a to 14b.

Referring to FIGS. 13A and 13B, the display panel DP-a according to an embodiment may be used as a navigation unit disposed in a vehicle MT. Light provided from the display panel DP-a may be reflected by a front glass FW of the vehicle MT and obstruct a driver's view.

The display panel DP-a according to an embodiment of the present inventive concept may include a light shielding member to solve a limitation in which the light provided from the display unit of the display panel DP-a is reflected by the front glass FW.

For example, referring to FIGS. 4 to 5B, when the light shielding member BM is provided so that the second partition wall P2 of the first portion P1 faces the front glass FW, the light of the second path L2 traveling to the front glass FW among light provided from the display unit may be blocked, and the light of the second path L1 traveling to a driver may be provided to the driver regardless of the second partition wall P2 having a great thickness of the light shielding member BM.

According to an embodiment of the present inventive concept, as the path of the light provided at a specific angle is blocked, the limitation in which the light provided from the display panel DP-a is reflected by the front glass may be solved. Also, a process and a cost associated with attaching a separate member (e.g., a film, etc.) for light shielding may be obviated.

Referring to FIGS. 14A and 14B, the display panel DP-b according to an embodiment of the present inventive concept may include a display module DM disposed in a display apparatus EA.

The display apparatus EA may include a window panel WP, a display module DM, and a housing. In this embodiment, the window panel WP and the housing HU may be coupled to provide an appearance of the display apparatus EA. The display module DM ma include a display panel DP-b and a driving circuit DC.

In an embodiment, the window panel WA may include an optically clear insulating material. For example, the window panel WP may include glass or plastic. The window panel WP may have a multilayer structure or a single layer structure. For example, the window panel WP may include a plurality of plastic films coupled by an adhesive or a glass substrate and a plastic film coupled by an adhesive.

As described above, the front surface of the window panel WP may define the display surface FS of the display apparatus EA. A transmission area TA may be an optically clear area. For example, in an embodiment the transmission area TA may have a visible light transmittance of about 90% or more. A bezel area BZA may have a relatively lower light transmittance than that of the transmission area TA. The bezel area BZA may define a shape of the transmission area TA. The bezel area BZA may be disposed adjacent to the transmission area TA and surround the transmission area TA (e.g., in the first and/or second directions DR1, DR2).

The display module DM may display an image and sense an external input. The display module DM may include a display surface DP-IS including an active area AA and a peripheral area NAA. The active area AA may be activated by an electrical signal.

In an embodiment, the display panel DP-b may include a display unit DU-b and an input sensor ISL-b. The display unit DU-b and the input sensor ISL-b of the display panel DP-b may correspond to the display unit DU-A and the input sensor ISL described in FIG. 8.

The driving circuit DC may be electrically connected to the display panel DP and the input sensor ISL. The driving circuit DC may include a main circuit board MB and a flexible circuit board CF.

The flexible circuit board CF may be electrically connected to the display panel DP-b. The flexible circuit board CF may connect the display panel DP-b and the main circuit board MB. However, embodiments of the present inventive concept are not necessarily limited thereto. For example, in an embodiment, the flexible circuit board CF may not be connected to the main circuit board MB. The first circuit hoard CF1 may be a rigid substrate.

The flexible circuit board CF may be connected to pads (e.g., display pads) of the display panel DP-b, which are disposed on the peripheral area NAA. The flexible circuit board CF may provide an electrical signal for driving the display panel DP-b to the display panel DP-b. The electrical signal may be generated from the flexible circuit board CF or the main circuit board MB.

The main circuit board MB may include all sorts of driving circuits for driving the display module OM or a connector for power supply. The main circuit board MB may be connected to the display module DM through the flexible circuit board CF.

The housing HU may be coupled with the window panel WP. The housing HU may be coupled with the window panel WP to provide a predetermined inner space. The display module DM may be accommodated in the inner space.

The housing HU may include a material having a relatively high rigidity. For example, in an embodiment the housing HU may include a plurality of frames and/or plates, which are made of glass, plastic, metal or a combination thereof. The housing HU may stably protect components of the display apparatus EA accommodated in the inner space from an external impact.

Although embodiments related to the display panel are described to be contained in the navigation unit of the vehicle and the electronic apparatus, embodiments of the present inventive concept are not necessarily limited thereto. For example, the display panel including the light shielding member according to an embodiment of the present inventive concept may be applied to a large-sized display apparatus such as a television, a monitor, or an outdoor advertisement board and a medium and small-sized display apparatus such as a personal computer, a notebook computer, a game console, a portable electronic device, and a camera.

According to an embodiment of the present inventive concept, the light shielding member may block the light provided at the specific angle and simultaneously prevent the color mixture between the adjacent light emitting areas providing light haling different colors.

Although embodiments of the present inventive concepts have been described, it is understood that the present inventive should not be limited to these embodiments but various changes and modifications can be made by one ordinary skilled in the art within the spirit and scope of the present inventive concepts.

What is claimed is:

1. A display panel comprising:
a display device layer comprising a first light emitting area, a second light emitting area spaced apart from the first light emitting area in a column direction, a third light emitting area spaced apart from the first light emitting area in a row direction crossing the column direction, and a non-light emitting area disposed between the first to third light emitting areas; and
a light shielding member disposed on the display device layer, the light shielding member overlaps the on-light emitting area and includes light shielding openings corresponding to the first to third light emitting areas,
wherein a first portion of the light shielding member disposed between the first light emitting area and the second light emitting area has a first thickness at a first edge adjacent to the first light emitting area and a second thickness that is different from the first thickness at a second edge adjacent to the second light emitting area, and
a second portion of the light shielding member disposed between the first light emitting area and the third light emitting area has a uniform thickness.

2. The display panel of claim 1, wherein the first thickness is less than the second thickness.

3. The display panel of claim 2, wherein the second portion has a same thickness as the first thickness.

4. The display panel of claim 1, wherein:
the display device layer fluffier comprises a fourth light emitting area spaced apart from the second light emitting area in the row direction and spaced apart from the third light emitting area in the column direction; and
a third portion disposed between the third light emitting area and the fourth light emitting area in the light shielding member has a third thickness at a third edge adjacent to the third light emitting area and a fourth thickness that is greater than the third thickness at a fourth edge adjacent to the fourth light emitting area.

5. The display panel of claim 4, wherein:
the third thickness is equal to the first thickness; and
the fourth thickness is equal to the second thickness.

6. The display panel of claim 4, wherein a fourth portion disposed between the second light emitting area and the fourth light emitting area in the light shielding member has a same thickness as the second portion.

7. The display panel of claim 4, wherein the first portion and the third portion have an integrated shape extending in the row direction.

8. The display panel of claim 1, wherein:
in a cross-section, the first portion comprises a first partition wall having the first edge having the first thickness and a second partition wall having the second edge having the second thickness; and
an angle between the first partition wall and the second partition wall is a right angle.

9. The display panel of claim 1, wherein the first portion has a curved surface having a thickness varying from the first thickness to the second thickness from the first edge to the second edge.

10. The display panel of claim 9, wherein the curved surface has an irregular shape.

11. The display panel of claim 1, further comprising:
an encapsulation layer disposed on the display device layer, the encapsulation layer includes inorganic layers and at least one organic layer disposed between the inorganic layers; and
the light shielding member is disposed on the encapsulation layer.

12. The display panel of claim 11, further comprising:
a cover layer covering the light shielding member; and
the cover layer comprises at least one of an organic material and an inorganic material.

13. The display panel of claim 1, further comprising:
an encapsulation layer disposed on the display device layer;
an input sensor disposed on the encapsulation layer and comprising mesh lines overlapping the light shielding member and a sensing insulation layer; and
a cover layer covering the light shielding member,
wherein the light shielding member is disposed on the input sensor.

14. The display panel of claim 13, further comprising an additional light shielding member disposed on the cover layer and an additional cover layer covering the additional light shielding member and disposed on the cover layer.

15. The display panel of claim 1, wherein the first to third light emitting areas have different surface areas from each other.

16. The display panel of claim 1, wherein the display device layer comprises: light emitting devices each comprising a first electrode, a second electrode, and a light emitting layer disposed between the first electrode and the second electrode; and a pixel defining layer comprising openings each exposing at least a portion of each of the first electrodes.

17. The display panel of claim 16, wherein:
the first thickness is less than the second thickness, and the second portion has the same thickness as the first thickness;
each of the openings is defined by inner surfaces of the pixel defining layer; and
one inner surface of the inner surfaces faces a portion having the second thickness in the light shielding member, and each of remaining inner surfaces of the inner surfaces faces a portion having the first thickness on a plane.

18. A display panel comprising:
a display device layer comprising light emitting areas spaced apart from each other in a first direction and a second direction that cross each other, and a non-light emitting area disposed between the light emitting areas; and
a light shielding member disposed on the display device layer, the light shielding member overlaps the non-light emitting area and includes light shielding openings corresponding to the light emitting areas,
wherein a first portion of the light shielding member has a first thickness at a first edge adjacent to a first light emitting area among the light emitting areas and a second thickness less than the first thickness at a second edge spaced apart from the first light emitting area, and
a second portion of the light shielding member facing the first portion in the first direction has a third thickness at a third edge adjacent to the first light emitting area and a fourth thickness greater than the third thickness at a fourth edge spaced further than the second edge from the first light emitting area.

19. The display panel of claim 18, wherein:
the first thickness is equal to the fourth thickness; and
the second thickness is equal to the third thickness.

20. The display panel of claim 18, wherein at least one side surface among side surfaces of each of the light emitting areas is adjacent to a portion having the first thickness in the light shielding member, and each of remaining side surfaces of the side surfaces are adjacent to a portion having the second thickness in the light shielding member.

* * * * *